(12) United States Patent
McMahan et al.

(10) Patent No.: US 7,862,410 B2
(45) Date of Patent: Jan. 4, 2011

(54) AIR REMOVAL UNIT

(75) Inventors: Lianne M. McMahan, Atkinson, NH (US); Lou Perry, Acton, MA (US); Prasad Rao, Westborough, MA (US); Brian McKenna, Merrimack, NH (US)

(73) Assignee: American Power Conversion Corporation, West Kingston, RI (US)

( * ) Notice: Subject to any disclaimer, the term of this patent is extended or adjusted under 35 U.S.C. 154(b) by 378 days.

(21) Appl. No.: 11/336,328

(22) Filed: Jan. 20, 2006

(65) Prior Publication Data
US 2007/0171613 A1    Jul. 26, 2007

(51) Int. Cl.
*H05K 5/00* (2006.01)
(52) U.S. Cl. .................................... 454/184
(58) Field of Classification Search ............... 454/184
See application file for complete search history.

(56) References Cited

U.S. PATENT DOCUMENTS

| | | | |
|---|---|---|---|
| 3,102,184 A | 8/1963 | Sherron | |
| 4,352,274 A | 10/1982 | Anderson et al. | |
| 4,774,631 A | 9/1988 | Okuyama et al. | 361/384 |
| 4,851,965 A | 7/1989 | Gabuzda et al. | 361/383 |
| 5,063,477 A | 11/1991 | Paggen et al. | |
| 5,210,680 A | 5/1993 | Scheibler | 361/384 |
| 5,409,419 A * | 4/1995 | Euchner et al. | 454/184 |
| 5,440,450 A | 8/1995 | Lau et al. | |
| 5,497,288 A | 3/1996 | Otis et al. | |
| 5,540,548 A | 7/1996 | Eberhardt et al. | |
| 5,544,012 A | 8/1996 | Koike | 361/695 |

(Continued)

FOREIGN PATENT DOCUMENTS

DE    101 28 367 A1    1/2003

(Continued)

OTHER PUBLICATIONS

International Search Report mailed Jun. 1, 2004.

(Continued)

*Primary Examiner*—Steve McAllister
*Assistant Examiner*—Helena Kosanovic
(74) *Attorney, Agent, or Firm*—Lando & Anastasi, LLP

(57) ABSTRACT

An air removal unit configured for removing exhaust air from an equipment rack or enclosure includes multiple fans to achieve a high airflow capacity while defining a compact and portable structure. The unit removably installs along an exhaust side of an equipment rack or enclosure to provide capabilities for managing the thermal output of equipment, such as servers, CPUs, communications, internetworking and other types of equipment. The unit includes one or more upper fan modules and one or more lower fan modules positioned below the upper fan modules. The upper and the lower fan modules are arranged in a stacked configuration along the depth of the unit with the lower fan modules positioned in an offset orientation relative to the upper fan modules. The stacked configuration and the offset orientation of the fan modules help to incorporate multiple fans with the unit while maintaining the compact and portable design. The unit is further configured to serve as a door of an equipment rack or enclosure to thereby provide access to the unit and the rack or enclosure during operation. The unit can be incorporated with a ventilation system or a cooling air system associated with an equipment room or data center.

26 Claims, 25 Drawing Sheets

U.S. PATENT DOCUMENTS

| | | | |
|---|---|---|---|
| 5,657,641 A | 8/1997 | Cunningham et al. | 62/263 |
| 5,718,628 A | 2/1998 | Nakazato et al. | 454/184 |
| 5,910,045 A | 6/1999 | Aoki et al. | 454/186 |
| 5,914,858 A | 6/1999 | McKeen et al. | 361/695 |
| 5,982,618 A | 11/1999 | Roos | 361/695 |
| 5,999,403 A | 12/1999 | Neustadt | 361/695 |
| 6,000,232 A | 12/1999 | Witten-Hannah et al. | |
| 6,052,282 A | 4/2000 | Sugiyama et al. | 361/690 |
| 6,075,698 A | 6/2000 | Hogan et al. | 361/695 |
| 6,101,459 A | 8/2000 | Tavallaei et al. | 702/132 |
| 6,104,607 A | 8/2000 | Behl | 361/687 |
| 6,145,502 A | 11/2000 | Lyons et al. | |
| 6,164,369 A | 12/2000 | Stoller | 165/104.33 |
| 6,198,628 B1 | 3/2001 | Smith | 361/695 |
| 6,222,729 B1 | 4/2001 | Yoshikawa | 361/695 |
| 6,252,770 B1 | 6/2001 | Yu et al. | |
| 6,288,897 B1 | 9/2001 | Fritschle et al. | 361/687 |
| 6,305,180 B1 | 10/2001 | Miller et al. | |
| 6,317,320 B1 | 11/2001 | Cosley et al. | |
| 6,368,064 B1 | 4/2002 | Bendikas et al. | |
| 6,375,561 B1 | 4/2002 | Nicolai et al. | |
| 6,406,257 B1 | 6/2002 | Houdek | |
| 6,412,292 B2 | 7/2002 | Spinazzola et al. | 62/89 |
| 6,459,579 B1 | 10/2002 | Farmer et al. | 361/695 |
| 6,462,944 B1 | 10/2002 | Lin | 361/687 |
| 6,463,997 B1 | 10/2002 | Nicolai et al. | |
| 6,494,050 B2 | 12/2002 | Spinazzola et al. | 62/89 |
| 6,535,382 B2 | 3/2003 | Bishop et al. | |
| 6,557,357 B2 | 5/2003 | Spinazzola et al. | 62/89 |
| 6,565,428 B2 | 5/2003 | Hsiao | 454/184 |
| 6,574,970 B2 | 6/2003 | Spinazzola et al. | 62/89 |
| 6,611,428 B1 | 8/2003 | Wong | |
| 6,668,565 B1 | 12/2003 | Johnson et al. | |
| 6,682,159 B2* | 1/2004 | Compagnucci | 312/334.24 |
| 6,704,196 B1 | 3/2004 | Rodriguez et al. | |
| 6,704,199 B2 | 3/2004 | Wiley | |
| 6,722,151 B2 | 4/2004 | Spinazzola et al. | 62/259.2 |
| 6,724,624 B1 | 4/2004 | Dodson | |
| 6,745,579 B2 | 6/2004 | Spinazzola et al. | 62/89 |
| 6,778,386 B2 | 8/2004 | Garnett et al. | 361/687 |
| 6,788,535 B2 | 9/2004 | Dodgen et al. | |
| 6,819,560 B2 | 11/2004 | Konshak et al. | 361/687 |
| 6,822,859 B2 | 11/2004 | Coglitore et al. | 361/687 |
| 6,889,752 B2* | 5/2005 | Stoller | 165/47 |
| 6,927,977 B2 | 8/2005 | Singer | |
| 7,033,267 B2 | 4/2006 | Rasmussen | |
| 7,112,131 B2 | 9/2006 | Rasmussen et al. | |
| 7,500,911 B2 | 3/2009 | Johnson et al. | |
| 2001/0029163 A1 | 10/2001 | Spinazzola et al. | |
| 2002/0007643 A1 | 1/2002 | Spinazzola et al. | 62/259.2 |
| 2002/0059804 A1 | 5/2002 | Spinazzola et al. | 62/259.2 |
| 2002/0108386 A1 | 8/2002 | Spinazzola et al. | 62/259.2 |
| 2002/0121555 A1 | 9/2002 | Cipolla et al. | |
| 2003/0235035 A1 | 12/2003 | Wintersteen et al. | |
| 2004/0099747 A1 | 5/2004 | Johnson et al. | |
| 2004/0160720 A1 | 8/2004 | Yamanashi et al. | |
| 2004/0227435 A1 | 11/2004 | Rasmussen | |
| 2005/0048896 A1* | 3/2005 | Shaben | 454/49 |
| 2005/0159098 A1* | 7/2005 | Johnson et al. | 454/184 |
| 2005/0170770 A1* | 8/2005 | Johnson et al. | 454/184 |
| 2006/0276121 A1 | 12/2006 | Rasmussen | |
| 2007/0129000 A1 | 6/2007 | Rasmussen et al. | |
| 2009/0308579 A1 | 12/2009 | Johnson et al. | |

FOREIGN PATENT DOCUMENTS

| | | |
|---|---|---|
| EP | 0 741 269 A2 | 6/1996 |
| EP | 0 741 269 B1 | 11/2001 |
| EP | 1 705 977 B1 | 9/2006 |
| FR | 2 193 303 | 2/1974 |
| FR | 2 831 019 A1 | 4/2003 |
| GB | 2 354 066 A | 3/2001 |
| JP | 51-55922 | 4/1976 |
| JP | 54-56503 | 4/1979 |
| JP | 59-151478 | 10/1984 |
| JP | 62-174397 | 11/1987 |
| JP | 3-85797 | 4/1991 |
| JP | 4-85785 | 7/1992 |
| JP | 5-15423 | 1/1993 |
| JP | 6-272694 | 9/1994 |
| JP | 7-98781 | 4/1995 |
| JP | 8-285421 | 11/1996 |
| JP | 9-64555 | 3/1997 |
| JP | 10-339500 | 12/1998 |
| JP | 11-184570 | 7/1999 |
| JP | 2000-47757 | 2/2000 |
| JP | 2000-112574 | 4/2000 |
| JP | 2000-315883 | 11/2000 |
| JP | 2001-257496 | 9/2001 |
| WO | 01/62060 A1 | 8/2001 |
| WO | 01/86217 A1 | 11/2001 |
| WO | 02/16854 A1 | 2/2002 |
| WO | 02/093093 A1 | 11/2002 |
| WO | 2004/049773 A2 | 6/2004 |

OTHER PUBLICATIONS

Liebert, "Foundation—60Hz", May 2002, 9 pages.
Liebert, "DataCool—60Hz", May 2002, 2 pages.
Website: http://www.sharkrack.com/cart/display/php?category id=16&product is=25.
Website: http://www.edpeurope.com/sharkrack.html.
Enterprise 4000/4500/Stor Rack Kit Installation Instructions, Oct. 1, 2001.
International Search Report mailed May 4, 2005.
International Search Report for PCT/US2005/005148 mailed Jun. 17, 2006.
European Search Report for EP 08 16 4463 dated Mar. 1, 2010.

* cited by examiner

AIR REMOVAL UNIT

FIELD OF THE INVENTION

The invention relates to an air removal unit for use with an equipment rack or equipment enclosure housing information, communications and/or other types of electronic equipment. The invention also relates to an air cooling system for an equipment room or data center including the air removal unit.

BACKGROUND OF THE INVENTION

Rack-mounted communications and information technology equipment, such as servers, CPUs, communications and internetworking equipment, consume electrical power and generate heat during operation. Without effective thermal management, heat generation can have adverse effects on the performance, reliability and useful life of equipment. For instance, heat generated from rack-mounted equipment contained within an enclosure can build-up within the confines of the enclosure and create hot spots that electronic components are particularly vulnerable to. Similarly, without managing the thermal output of equipment racks or enclosures, hot spots and adverse thermal conditions can develop in equipment rooms and data centers, creating inferior operating environments.

The amount of heat a given equipment rack or enclosure can generate varies considerably and depends on the amount of electrical power rack-mounted equipment draw during operation. Thermal output can be reported as kilowatts of power consumed and can range widely from a few tens of watts up to about 10 kW, depending upon the type of equipment. As equipment needs change and new equipment needs develop, heat output can change significantly as equipment components are added, replaced or rearranged within a rack, requiring adjustments to any thermal management protocol. For instance, depending upon the type and the number of components, heat output can vary from a few watts per U unit of rack capacity to over 1 kW per U unit.

Rack-mounted equipment components are typically designed to meet cooling requirements by drawing air from an air intake portion of a rack or enclosure across their exterior surfaces and/or through interior portions of components to thereby remove heat and cool components. Effective heat management of a given rack or enclosure therefore requires a sufficient volume of cooling air and an effective airflow rate into the rack or enclosure to meet cooling needs. For instance, most equipment designs require cooling airflow rates of from about 120 cubic feet per minute (cfm) per kilowatt of power consumed. In this instance, a rack or enclosure that consumes about 15 kW of electrical power would require a relatively substantial airflow rate of about 1,800 cfm.

Prior art systems and methods for cooling rack-mounted equipment components and providing thermal management typically include an air conditioning or cooling system that supplies and circulates cool or chilled air to equipment rooms and data centers. Many of such prior art systems and methods include a raised or double floor infrastructure of an equipment room or data center to facilitate air conditioning and air circulation functions. Raised or double floor construction includes an air supply channel defined between an outer floor and a lower floor of an equipment room or data center that delivers cool or chilled air from an air conditioning or cooling system to the equipment room or data center. Cool or chilled air is typically vented into the equipment room from the supply channel through open floor tiles, grills or vents located in front of racks and enclosures and along aisles between rows of racks and enclosures. In addition, cool or chilled air is vented from the supply channel directly into rack and enclosure interiors using ducts or hoses connected over open floor tiles, grills or vents.

Racks and enclosures that house high power equipment, e.g., consuming from about 5 kW up to about 15 kW of power, consequently have a high thermal output and would require high airflow rates of up to approximately 1,800 cfm to manage heat generated and to cool equipment components. Open floor tiles, grills or vents used in raised floor configurations typically define a venting area of about one (1) square foot and are typically configured to deliver approximately 200 cfm to 500 cfm of cooling air. Such airflow rates can be affected by a number of conditions and obstructions including static air pressure and other floor tiles. As a result, typical airflow rates delivered through floor tiles, grills or vents are more likely on the order of approximately 100 cfm to 200 cfm. Therefore, to provide high airflow rates of up to approximately 1,800 cfm for a rack or enclosure of high power equipment, 3.5 to about 5 open floor tiles, grills or vents would be required to supply sufficient cooling air. This floor configuration may be difficult or impossible to provide if the equipment room or data center is crowded and includes multiple high power racks or enclosures, and such racks or enclosures are arranged side-by-side in rows.

In addition, raised floor configurations are relatively inflexible with respect to reconfiguring and rearranging an equipment room or data center to meet changing and new equipment needs. To accommodate changes in cooling requirements as a result of equipment room reconfiguration, raised floor configurations and associated cooling systems would need to be reconfigured and/or retrofitted at considerable cost to provide different and new airflow rates and paths. Such raised floor configurations therefore do not inexpensively accommodate the manner in which equipment components and racks or enclosures are deployed in an equipment room.

Further, raised floor configurations and associated cooling systems are not flexible or portable with respect to different power consumptions between different racks and enclosures and different areas within a given equipment room or data center. Therefore, a given equipment room can have different airflow requirements between racks and between rows of racks. In this case, raised floor configurations cannot easily and cost effectively vary and/or concentrate cooling airflow where needed within the equipment room. Local thermal problems, such as thermal gradients and hot spots, therefore can result due to insufficient cooling.

Thus, a cost effective device and/or system is needed to accommodate relatively high airflow rates required to meet the cooling requirements of equipment components and racks and enclosures generating relatively high thermal outputs while providing portability and flexibility with respect to configuration of rack and equipment rooms and data centers.

SUMMARY OF INVENTION

In general, in an aspect, the invention provides an air removal unit for removing exhaust air from an equipment rack or enclosure. The unit comprises a housing defining an interior chamber and an upper exhaust module disposed within the interior chamber. The upper exhaust module includes at least one upper fan module including a fan coupled with a first internal air plenum. The unit further comprises a lower exhaust module disposed within the interior chamber below the upper exhaust module. The lower exhaust module includes at least one lower fan module including a fan coupled with a second internal air plenum. The upper exhaust module and the lower exhaust module are further disposed in a stacked configuration along the depth of the unit with the lower fan module positioned in an offset orientation relative to the upper fan module. Each fan of the unit is disposed such that when the unit is mounted to an exhaust side of an equipment rack or enclosure, an air intake side of each fan is in fluid communication with an interior of the equipment rack or enclosure.

Implementations of the invention may include one or more of the following features. The housing of the unit is constructed and arranged such that the unit forms at least part of a door of the equipment rack or enclosure when the unit is installed to the equipment rack or enclosure. The housing is configured along a first side to removably connect to the equipment rack or enclosure to permit the unit to pivot toward and away from the equipment rack or enclosure along the first side in a door-like manner.

The unit may further comprise a frame assembly constructed and arranged to removably connect to an equipment rack or enclosure, and further constructed and arranged to receive and constrain the unit thereto. The frame assembly is configured along a first side to removably connect to a first side of the housing and is connected to the housing to permit the unit to pivot toward and away from the equipment rack or enclosure in a door-like manner. The first side of the frame assembly is connected to the first side of the housing via hinge means. The frame assembly includes a pair of adjacent parallel longitudinal members, each longitudinal member constructed and arranged to telescopically extend or retract to adjust the height of the frame assembly.

In addition, the unit also may comprise a blanking panel. The blanking panel is constructed and arranged to removably connect to a bottom portion of the unit and to blank-off an exposed area disposed below the unit when the unit is installed to the equipment rack or enclosure to help to minimize loss of air from the unit, and also to help to minimize flow of air from and into an interior of the equipment rack or enclosure.

Implementations of the invention may also include one or more of the following features. The first and the second internal air plenums are configured and arranged to terminate into an exhaust port defined along a top of the unit. Each of the first internal air plenum and the second internal air plenum are configured and arranged within the corresponding upper exhaust module and lower exhaust module such that each of the first internal air plenum and the second internal air plenum about equally impede fan-exhausted air. The upper fan module draws-in air and forces drawn-in air into the first internal air plenum at at least one of: (i) a rate about equal to a rate at which the lower fan module draws-in air and forces drawn-in air into the second internal air plenum and (ii) a rate variable to a rate at which the lower fan module draws-in air and forces drawn-in air into the second internal air plenum.

Implementations of the invention may further include one or more of the following features. At least one of the fan of the upper fan module and the fan of the lower fan module is operatively coupled to a controller. The controller is configured to control the speed of the fan. The fan is configured to operate at a variable speed. The controller is further configured to adjust the variable speed of the fan in response to one or more operating parameters of the unit. The controller adjusts the fan speed in response to at least of: (i) one or more temperatures within the unit determined at one or more given times; (ii) one or more temperatures within the equipment rack or enclosure determined at one or more given times; and (iii) one or more power loads of the equipment rack or enclo- sure determined at one or more given times. The controller is operatively connected to a network controller via a network and further configured to provide information to the network controller related to one or more operating parameters of the unit. The network controller is configured to provide one or more control signals to at least one of the controller and the upper or the lower fan module to control the one or more operating parameters of the unit.

In general, in another aspect, the invention provides an air removal unit for removing exhaust air from an equipment rack or enclosure, the unit comprising a housing defining an interior chamber and at least one upper fan module disposed within the interior chamber. The at least one upper fan module includes a fan coupled with a first internal air plenum. In addition, the unit further comprises at least one lower fan module disposed within the interior chamber below the at least one upper fan module. The at least one lower fan module includes a fan coupled with a second internal air plenum. The at least one lower fan module is coupled with the at least one upper fan module in a stacked configuration along the depth of the unit such that an air intake side of the at least one lower fan module positioned in an offset orientation relative to an air intake side of the at least one upper fan module.

In general, in a further aspect, the invention provides an air removal unit for removing exhaust air from an equipment rack or enclosure, the unit comprising a housing defining an interior chamber and a first and a second upper fan module disposed in the interior chamber. Each upper fan module includes a fan coupled with an upper internal air plenum. The first and second upper fan modules are disposed adjacent one another along the width of the unit. A first and a second lower fan module is disposed in the interior chamber below the first and second upper fan modules. Each lower fan module includes a fan coupled with a lower internal air plenum. The first and second lower fan modules are disposed adjacent one another along the width of the unit. The first and second upper fan modules and the first and second lower fan modules are further disposed in a stacked configuration along the depth of the unit with the first and second lower fan modules positioned in an offset orientation relative to the first and second upper fan modules.

In general, in yet another aspect, the invention provides a system for exhausting air from an equipment rack or an equipment enclosure. The system comprises an air removal unit constructed and arranged to mount to a section of the equipment rack or enclosure from which exhaust air vents and to provide fluid communication between the air removal unit and an interior of the equipment rack or enclosure. The air removal unit includes at least one upper fan module disposed within an interior chamber of a housing. The at least one upper fan module includes a fan coupled with a first internal air plenum extending to an exhaust port defined at a top of the housing. In addition, the unit further includes at least one lower fan module disposed within the interior chamber below the at least one upper fan module. The at least one lower fan module includes a fan coupled with a second internal air plenum extending to the exhaust port. The at least one lower fan module is coupled with the at least one upper fan module in a stacked configuration along the depth of the unit such that an air intake side of the at least one lower fan module is positioned in an offset orientation relative to an air intake side of the at least one upper fan module. The system further comprises an outer exhaust duct coupled with the exhaust port and configured to receive exhaust air from the first and second internal air plenums and to channel the exhaust air to an area external to the unit.

Implementations of the invention may provide one or more of the following features. The outer exhaust duct of the cooling air system includes a return air plenum in fluid communication with an air conditioning system and is configured to direct the exhaust air to the air conditioning system for cooling before the air is returned to an equipment room or data center in which the equipment rack or enclosure is located. The the air conditioning system is configured to cool the exhaust air to a range of temperatures from about 60 degrees F. to about 70 degrees F. Alternatively, or additionally, the outer exhaust duct includes an exhaust air plenum in fluid communication with a ventilation system and configured to direct the exhaust air to the ventilation system for removal from an equipment room or data center in which the equipment rack or enclosure is located.

Various aspects of the invention provide one or more of the following features or advantages. An air removal unit including multiple fans and defining a compact and portable structure is configured for direct and removable installation to an exhaust side of an equipment rack or enclosure. The air removal unit provides a high airflow capacity, e.g., from about 400 cfm to about 2,000 cfm of air, to remove exhaust air from racks or enclosures at a rate that effectively manages the thermal output of equipment, such as, for instance, information and telecommunications equipment.

The unit includes a chassis housing containing at least two adjacent exhaust modules, including an upper exhaust module and a lower exhaust module disposed in a stacked configuration along the axis of depth, e.g. Z axis, of the unit. Each exhaust module includes at least two adjacent fan modules to provide heat removal redundancy.

Each fan module includes a fan, an air intake inlet ring and associated fan monitoring and control electronics that are removably connected to a back panel of the chassis housing. Each fan module operates individually and/or simultaneously with one or more of the other fan modules to provide effective management of thermal output of equipment.

When each of the two fan modules of the upper exhaust module and the lower exhaust module are assembled and removably mounted to the back panel and the chassis housing, the air intake inlet ring of each module and one or more interior walls defined with the housing couple to define an internal air plenum to which the fan couples. The upper and lower fan modules, each including the fan and the inlet ring, thereby help to define separate internal air plenums within the upper and the lower exhaust modules. In addition, the air intake inlet ring further serves to help to define the motion and the path of air exhausted from each fan into its air plenum.

The configurations of the air intake inlet rings and the internal air plenums help to define at least two separate and optimal airflow paths through the upper exhaust module and at least two separate and optimal airflow paths through the lower exhaust module to thereby provide four fans with four internal air plenums dedicated for air removal within the unit. The configurations of the air intake inlet rings and the internal air plenums further help to minimize air turbulence of fan-exhausted air being channeled through the air plenums as well as help to minimize air resistance within the air plenums. The intake inlet rings and the internal air plenums, as well as the number of fans, thereby help to enhance the airflow or exhaust capacity of the unit while limiting air turbulence and air resistance.

The stacked configuration of the upper exhaust module and the lower exhaust module along the depth of the unit helps to incorporate multiple fans with the unit and thereby helps to provide the unit with a high airflow capacity. In addition, the stacked configuration of the upper and the lower exhaust modules helps to define the unit with a compact and portable design that facilitates ease during installation and permits access to the unit and its components when installed to a rack or enclosure or during operation of the unit. Further, the lower exhaust module is further disposed in an offset orientation relative to the upper exhaust module to further help to incorporate multiple fans with the unit while maintaining the desired vertical length or height of the unit. The upper fan modules and the lower fan modules are thereby disposed in the offset orientation relative to one another, which provides advantages with respect to reducing or eliminating any interference or obstruction of airflow into one fan module by airflow of an adjacent fan module. The lower fan modules are further disposed at an angled orientation relative to the upper fan modules. The offset and angled orientation of the lower fan modules relative to the upper fan modules further helps to minimize the vertical length or height of the unit and helps to maintain the overall compact and portable design while providing the unit with multiple fans and thereby a high airflow capacity.

The portable and compact design renders the air removal unit lightweight and easy to install to and to detach from an equipment rack or enclosure. The ease of installation and portability of the compact design provides flexibility to the unit with respect to configuring or rearranging an equipment room or data center to meet new or changing equipment needs.

The air removal unit is removably connected to a rack or enclosure and designed to permit in-field installation and replacement. In addition, many of the components of the unit are removably connected thereto to enable in-field installation, maintenance, service and replacement. For instance, the unit's monitoring and control electronics module including an interactive programmable controller and other control electronics modules are removably connected and thereby field-serviceable and field-replaceable. In another instance, each fan module, and its respective components including the fan, the inlet ring and the associated electronics, are removably connected to the upper or lower back panel of the housing such that these components may be readily maintained and serviced in the field or replaced without removing the unit from operation. In addition, the unit permits in-field installation, maintenance and service of equipment components housed within a rack or enclosure.

The air removal unit is removably connected to a rack or enclosure by means of a frame assembly that is constructed and arranged to quickly and easily install to and detach from a rack. The frame assembly is configured and arranged to receive the unit and to constrain the unit with hinged connections such that when the unit is connected to the frame assembly, the unit pivots about the hinged connections. The hinged connections thereby permit the unit to operate like a door when installed to a rack or enclosure such that the unit moves outwardly away from the rack or enclosure to provide access to, for instance, the interior of the unit, the fan modules and the unit's monitoring and control electronics module. In addition, the unit provides access to the interior of the rack or enclosure.

In addition, the frame assembly is constructed and arranged with an upper and a lower set of longitudinally telescoping members wherein one set of members is slidably received by the other set of members such that the vertical length or height of the frame assembly may be adjusted to accommodate the height of a given rack. The frame assembly thereby enables the unit to be installed to racks having different heights without substantially retrofitting the unit and the frame assembly.

The high airflow capacity achieved with the upper and the lower fan modules helps to eliminate or minimize the incidence of heat build-up and hot spots within a rack or enclosure during operation of equipment. In addition, the upper and the lower internal air plenums, defined in part by the fan modules, e.g., the air inlet ring, and the one or more interior walls within the housing, are configured to receive and to contain exhaust air removed by its respective fan with substantially little or no leaking of exhaust air from the unit. Exhaust air is thereby removed from a rack or enclosure and contained within the air removal unit until it is vented to an area external to the rack or enclosure. In addition, as mentioned, the configuration of the internal air plenums helps to reduce air resistance and air turbulence along the air plenums such the fan-exhausted air vents effectively from the unit.

The removal and containment of exhaust air afforded by the unit helps to minimize mixing of exhaust air with cooling air, e.g., ambient air circulating in an equipment room or data center, from which equipment components draw to meet cooling needs.

In addition, the airflow capacity of the air removal unit and its ability to contain and vent exhaust air not only helps to ensure sufficient removal of hot and warm exhaust air but also helps to prevent or minimize airflow resistance along an exhaust side of a rack or enclosure. Airflow resistance along an exhaust side is caused by high air pressure or backpressure. High air pressure or backpressure creates adverse airflow conditions within a rack or enclosure that cooling fans of equipment components must overcome in order to draw air into the rack or enclosure for cooling. During operation, equipment cooling fans must draw sufficient volumes of cooling air from an air intake side of a rack or enclosure into the interiors of equipment components at an effective flow rate to meet cooling needs. If cooling fans cannot overcome airflow resistance, sufficient cooling air may not be drawn into the rack or enclosure or into equipment interiors. As a result, heat may build-up and hot spots may be created within the rack or enclosure. The air removal unit removes exhaust air at a high or effective rate along the exhaust side of a rack or enclosure such that airflow resistance due to air pressure or backpressure is eliminated or substantially reduced, e.g., to permit equipment cooling fans to operate properly. The air removal unit thereby facilitates optimal operation of equipment cooling fans to draw-in sufficient cooling air at effective flow rates to cool components during operation.

The air removal unit is suitable for equipment cooling protocols that use ambient air circulating in an equipment room or data center to cool equipment. In this case, equipment cooling fans would draw ambient air into a rack or enclosure and into the interiors of equipment components. Temperatures of ambient air within an equipment room or data center would be maintained within a desirable range for cooling, e.g., from about 60° F. to about 70° F., due to, in part, the containment and removal of exhaust air the air removal unit provides and due to the consequent prevention or minimization of mixing of exhaust air with ambient air. With such protocols, the air removal unit may be operatively connected to an exhaust or return air plenum, e.g., a ceiling plenum, that vents air to an area external to an equipment room or data center.

In addition, the air removal unit may be integrated into a cooling air system that includes an air cooler or conditioner and a return air plenum as described above. The return air plenum may receive exhaust air from the air removal unit and supply it to the air cooler or conditioner such that air is cooled or conditioned before it is returned and supplied to an equipment room or data center from which it was vented. The cooling air system in which the air removal unit is incorporated thereby eliminates the need for a double or raised floor configuration and refrigeration equipment to provide chilled or cold air for cooling. In effect, the air removal unit and the cooling air system each essentially avoid the infrastructure requirements and the operating and maintenance costs associated with raised floor configurations, while it provides high flow rates of cooling air.

These and other advantages of the invention, along with the invention itself, will be more fully understood after a review of the following figures, detailed description, and claims.

DETAILED DESCRIPTION OF PREFERRED EMBODIMENTS

Figure 1:
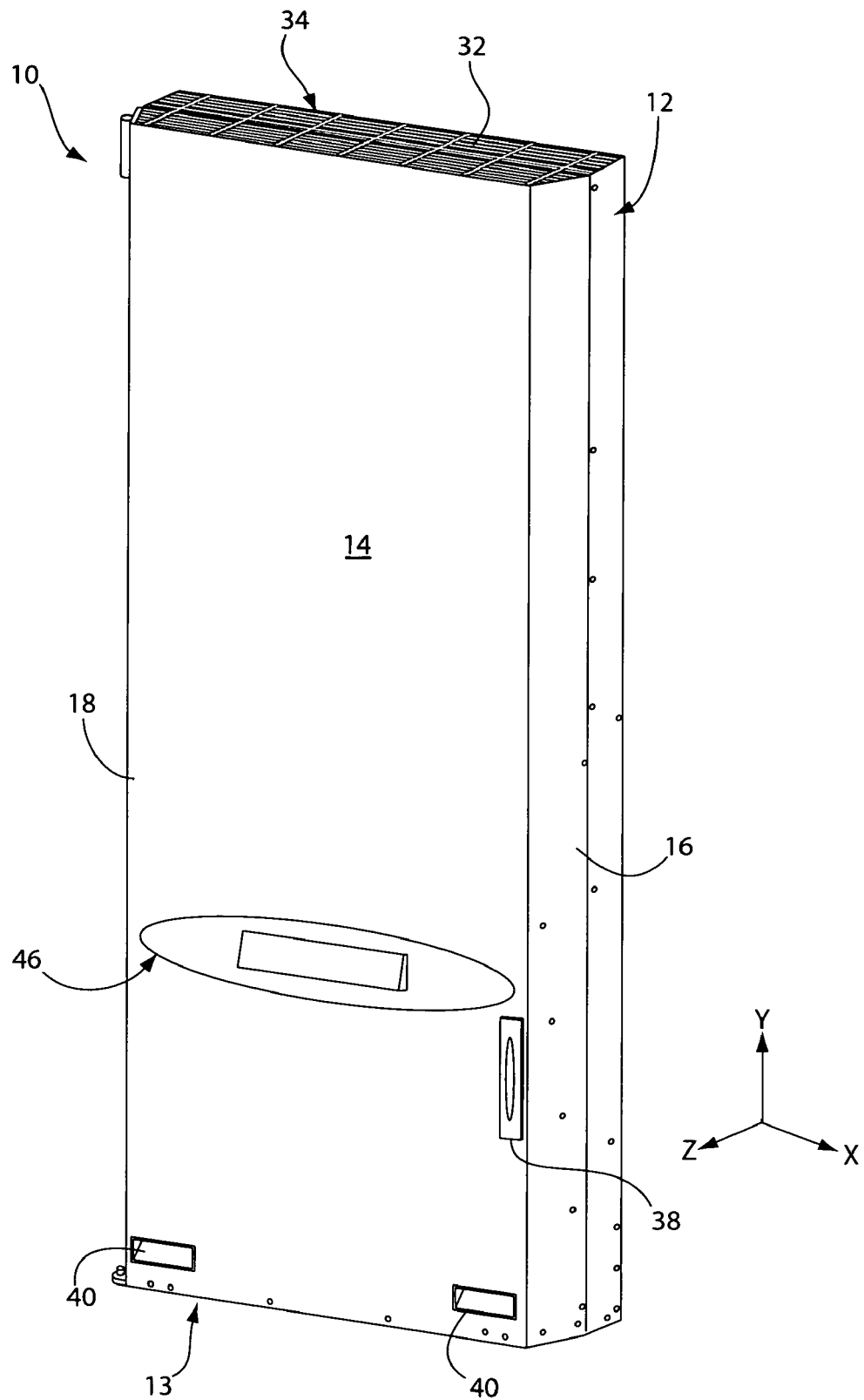
FIG. 1 is a front perspective view of an air removal unit according to the invention including a main housing.

The invention provides an air removal unit for removing exhaust air from a rack or an enclosure designed to house information, communications and/or other types of electronic equipment. The air removal unit according to the invention is configured to remove exhaust air from an equipment rack or enclosure to help to manage the thermal output of rack-mounted equipment, such as servers, CPUs and other electronics. The unit is constructed and arranged to mount or install directly to an exhaust side of an equipment rack or enclosure and to serve as a moveable panel or door of the rack or enclosure. The configuration and design of the unit thereby enables the unit to install to existing racks or enclosures without significant retrofitting and further permits in-field installation, maintenance, service and replacement of the unit and its components.

The unit includes an upper and a lower exhaust module contained within a single housing wherein each exhaust module includes two fan modules. Each fan module includes a field-replaceable exhaust air removal fan and associated electronics for monitoring and controlling fan speed. Each fan is disposed and is configured to draw exhaust air from a rack or enclosure and to vent drawn-in air into an internal air plenum defined within the interior of the unit housing to which the fan is coupled. The internal air plenum is configured to define an airflow path for venting exhaust air from the unit and is further configured to help to minimize air turbulence and airflow resistance along the airflow path. The fan module further includes an air intake inlet ring coupled with each fan that helps to mount the fan to the unit and further helps to define the fan's internal air plenum. The inlet ring is configured and is disposed to help to direct the path and the motion of fan-exhausted air into each fan's air plenum to thereby help to further minimize air turbulence and air resistance along the exhaust airflow path.

The fan modules and their respective internal air plenums are thereby constructed and arranged to provide a high exhaust airflow capacity and to define an optimal airflow path for exhaust air removal. In addition, the fan modules and the internal air plenums are further constructed and arranged to contain and to channel exhaust air away from an equipment rack or enclosure to help to prevent or reduce recirculation of exhaust air to equipment, as well as to help to prevent or reduce mixing of exhaust air with available cooling air. Further, by removing exhaust air from an equipment rack or enclosure, the fan modules and the air plenums help to reduce or minimize airflow resistance within the rack or enclosure such that rack-mounted equipment components may draw-in sufficient volumes of cooling air at effective flow rates to meet cooling needs and to thereby help to manage the thermal output of the rack or enclosure.

Each of the upper and the lower exhaust modules therefore includes two fan modules and two dedicated internal air plenums within the single unit housing to provide the unit with four air removal fans and four internal air plenums. The upper exhaust module and the lower exhaust module are disposed in the housing in a stacked configuration relative to one another along the depth of the unit. In addition, the lower fan modules of the lower exhaust module are further disposed in an offset orientation relative to the upper fan modules of the upper exhaust module. The stacked configuration of the upper and lower exhaust modules and the offset orientation of the upper and lower fan modules help to configure the unit with multiple air removal fans to achieve a high airflow capacity while defining the unit in a compact design. The compact design of the unit provides portability and flexibility with respect to installation of the unit as well as with respect to in-field maintenance, service and replacement of the unit and any of its components, such as the air removal fans and monitoring and control electronics. The stacked configuration of the exhaust modules and the offset orientation of the fan modules further help to configure the unit with overall dimensions that permit the unit to serve as a door of an equipment rack or enclosure.

The unit further includes an interactive programmable controller disposed within the interior of the unit housing that is configured and designed for operative connection to the fan module electronics for monitoring and controlling fan speed manually and/or automatically. In addition, the unit further includes a remote network connector for operatively connecting the programmable controller to a network and a remote network controller to enable remote monitoring and control of a single unit and/or multiple units located in one or more equipment rooms or data centers.

The air removal unit according to the invention is configured and arranged such that the unit may be operatively coupled with an air ventilation system of an equipment room or data center used to condition air and/or to vent exhaust air to areas external to the equipment room or data center. The unit also is configured and arranged to be operatively coupled with an air conditioning system associated with an equipment room or data center that supplies conditioned or cooled air to the equipment room or data center to meet equipment cooling needs. In this case, the exhaust air the unit removes is circulated to the air conditioning system for conditioning and/or cooling before the air is returned to the equipment room or data center. In either instance, the unit is incorporated in an integrated system for removing exhaust air and/or for supplying conditioned and/or cooled air to equipment rooms or data centers to manage thermal output and to meet equipment cooling requirements.

Figure 2A:
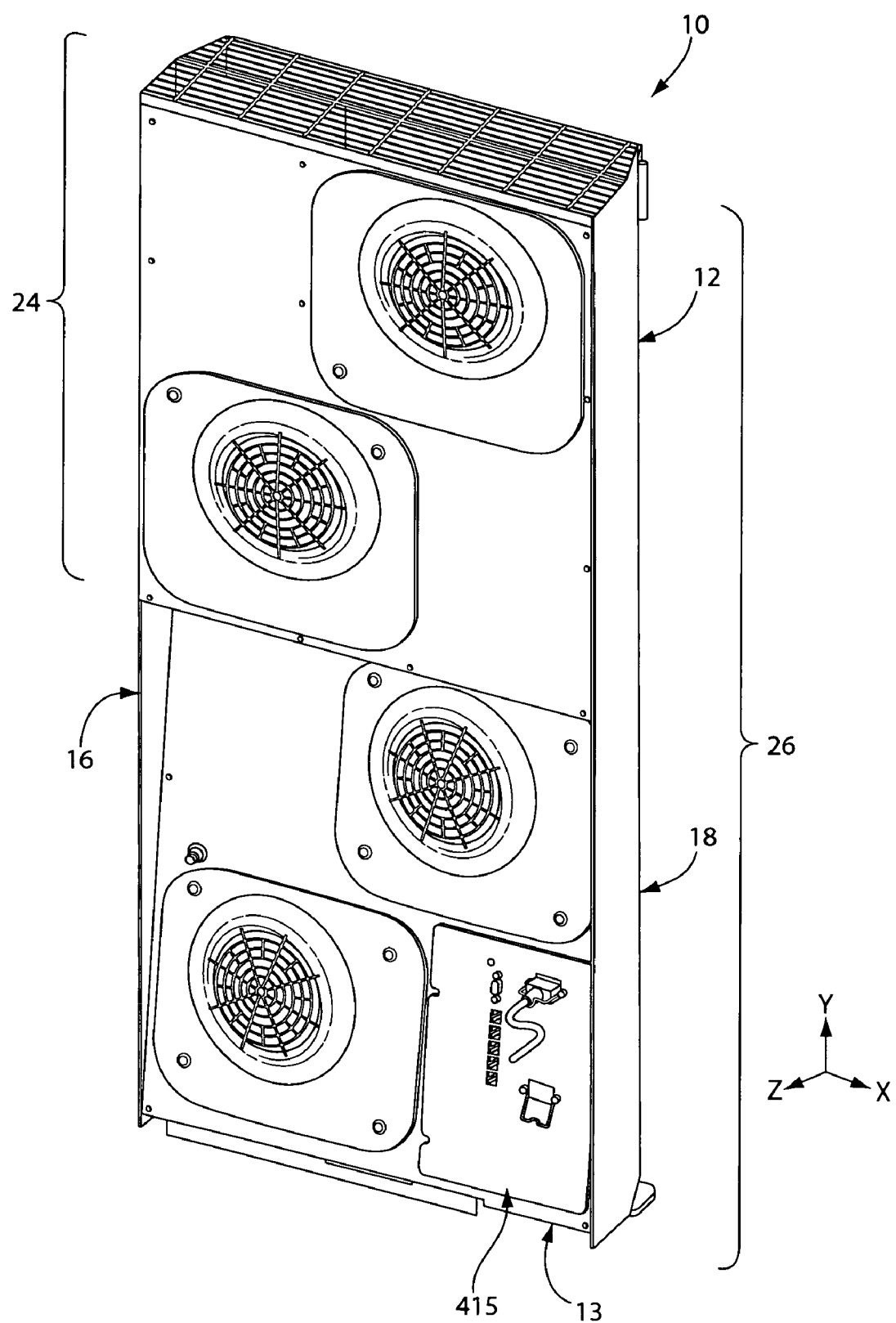
FIG. 2A is a perspective view of an air intake side of the unit shown in FIG. 1 illustrating multiple fan modules.
Figure 2B:
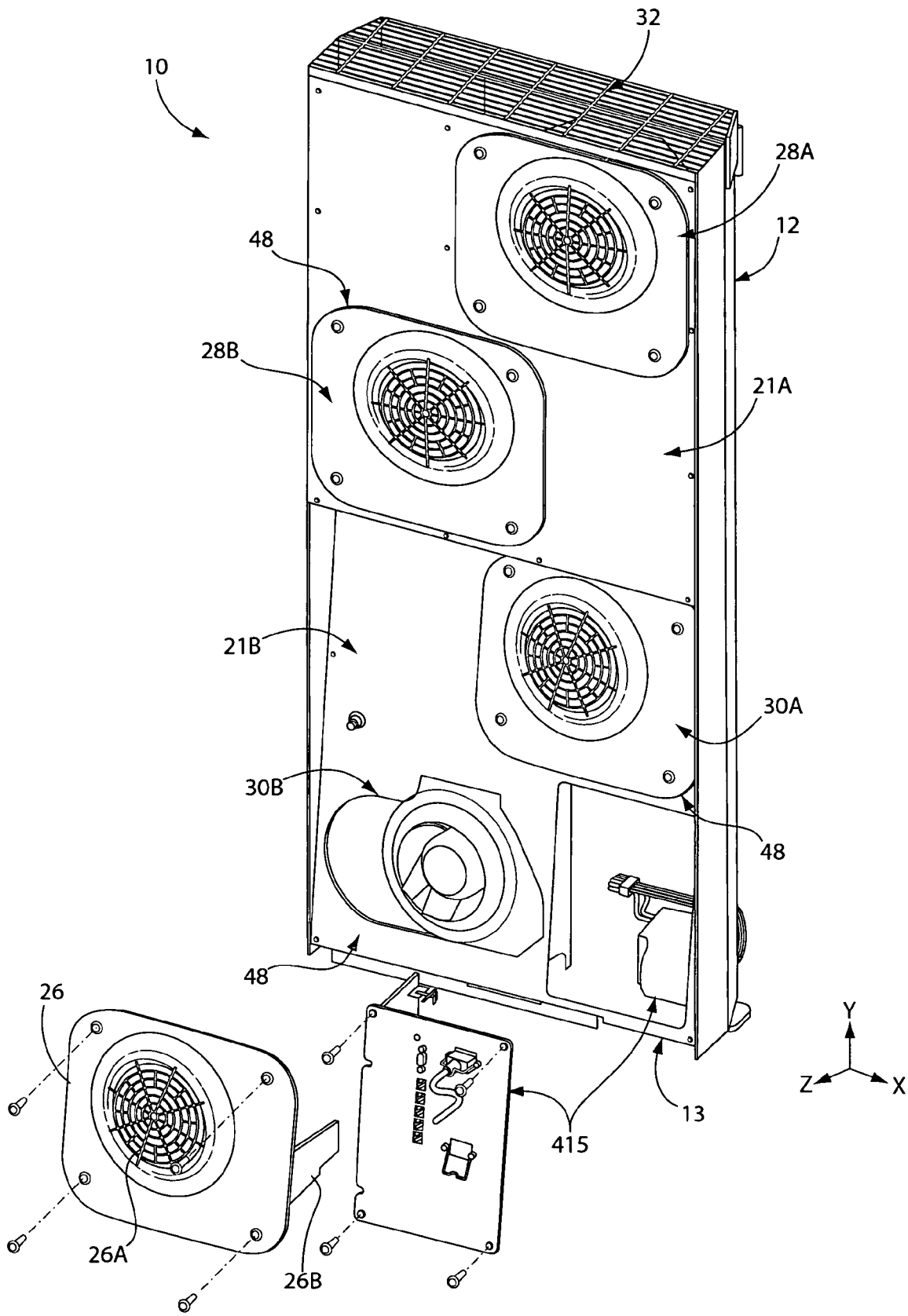
FIG. 2B is a perspective view of the air intake side of the unit shown in FIGS. 1 and 2A illustrating components of a fan module including an air intake inlet ring and a fan.

Referring to FIGS. 1 and 2A-2B, in an aspect, the invention provides an air removal unit 10 including a housing 12 configured as a three-sided chassis and constructed and arranged to contain a first or upper exhaust air module 24 and a second or lower exhaust air module 26. When the unit 10 is assembled, the chassis housing 12 contains the upper and the lower exhaust modules 24 and 26 such that the exhaust modules 24 and 26 are disposed adjacent one another and are arranged in a stacked configuration along the axis of depth Z of the unit 10. As shown in FIGS. 2A and 2B, and as will be described in detail below, the lower exhaust module 26 is further disposed at an offset orientation relative to the upper exhaust module 24 in order to incorporate multiple air removal fans into the unit 10.

The stacked configuration of the upper and the lower exhaust modules 24 and 26 permits installation of multiple exhaust fans in the unit 10 to enhance the airflow capacity of each exhaust module 24 and 26 and to thereby enhance or optimize the air removal or exhaust capacity of the unit 10. In addition, the stacked configuration of the exhaust modules 24 and 26 helps to minimize air turbulence and air resistance along the exhaust air paths during operation of the unit 10. Further, the stacked configuration defines the unit 10 with a compact and portable design to facilitate installation of the unit 10 and to enable in-field maintenance, service and replacement of the unit 10 and any of its components, especially when the unit 10 is installed to an equipment rack or enclosure and during operation of the unit 10. The compact and portable design of the unit 10 further provides flexibility with respect to configuring equipment rooms and data centers to provide thermal output management where needed.

The three-sided chassis housing 12 includes a front panel 14 and a first side wall 16 and a second side wall 18 connected to the front panel 14. The housing 12 further includes a bottom plate 13 disposed along a bottom portion of the housing 12 between the first and the second side walls 16 and 18. In addition, the housing 12 defines along its top or uppermost portion an exhaust vent 32 configured to permit air, drawn into the exhaust modules 24 and 26 and exhausted therefrom, to vent from the interior of the exhaust modules 24 and 26 to an area external to the unit 10. The uppermost portion of the housing 12 and the exhaust vent 32 are configured to permit the unit 10 to connect to one or more exhaust air ducts or plenums, as will be described in detail below. The exhaust vent 32 is further configured to receive a top grill 34 that serves as a guard to help to prevent objects or debris from falling into the unit 10 and to help to prevent injury to an operator's hands or fingers.

When the unit 10 is assembled, the chassis housing 12 is configured for installation of the unit 10 along an exhaust side of an equipment rack or enclosure into which servers and other equipment components vent exhaust air. The construction and arrangement of the chassis housing 12 helps to define the unit 10 as a hinged assembly that serves as a door or hinged panel when installed to an equipment rack or enclosure. The unit 10 thereby operates in a door-like manner to provide access to the interior of the equipment rack or enclosure as well as to provide access to the interior of the unit 10 and its components for installation, maintenance, service and replacement.

As will be described in detail below, each exhaust module 24 and 26 is disposed and configured such that, when the unit 10 is installed to an equipment rack or enclosure, each exhaust module 24 and 26 draws-in and thereby removes exhaust air from within the interior of the rack or enclosure. Each exhaust module 24 and 26 is further disposed and configured to contain and to channel drawn-in exhaust air toward the exhaust vent 32 from which exhaust air vents to an area external to the unit 10 and the rack or enclosure.

Further, as will be described in detail below, the chassis housing 12 is constructed and arranged to contain within its interior the unit's 10 monitoring and control electronics module housing various electronics including, but not limited to, an interactive programmable controller, power electronics, and any other electronics configured to detect and/or to measure any of a variety of operating parameters, e.g., fan speed control, and/or environmental conditions within the unit 10 or the rack or enclosure to which the unit 10 is installed.

Figure 3A:
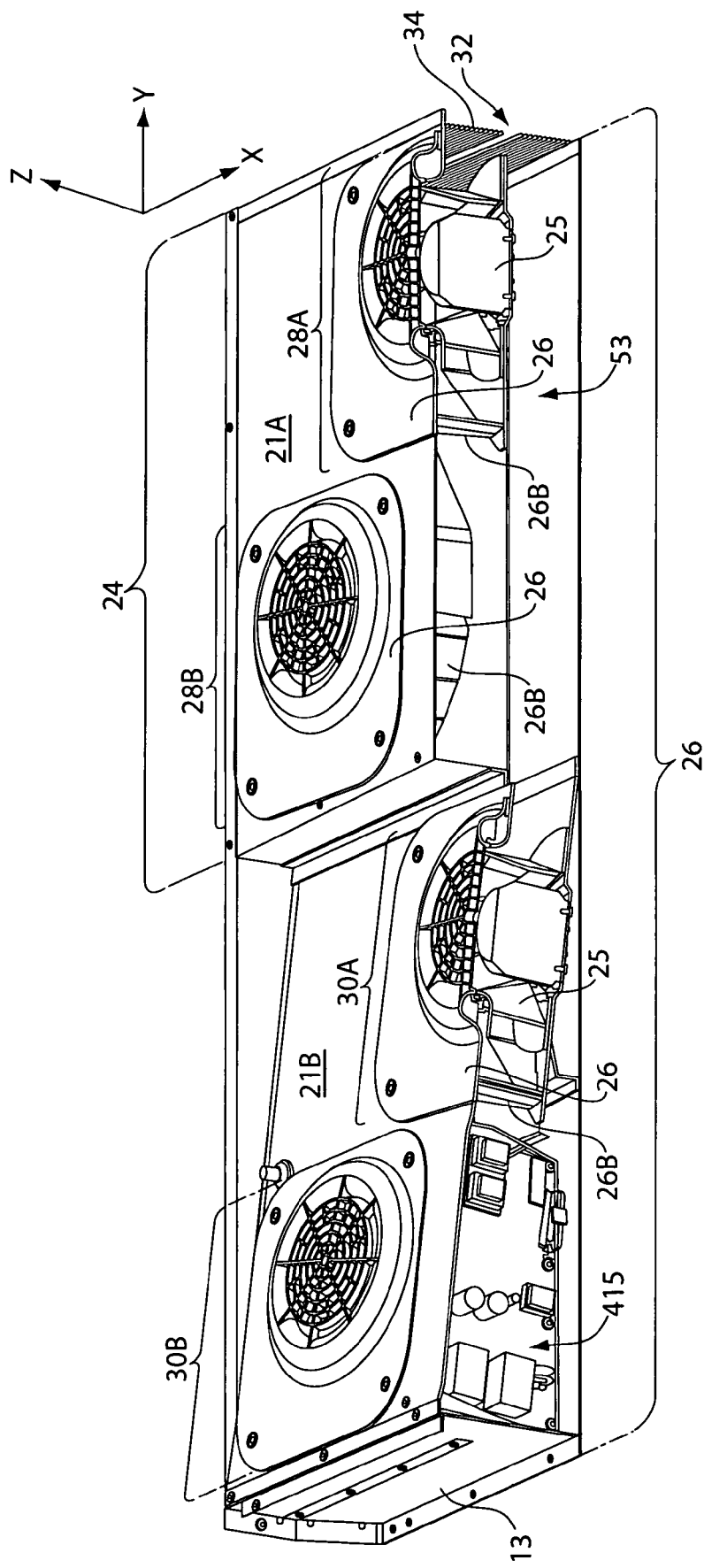
FIG. 3A is a cross-sectional perspective side view of the unit shown in FIGS. 2A and 2B.
Figure 3B:
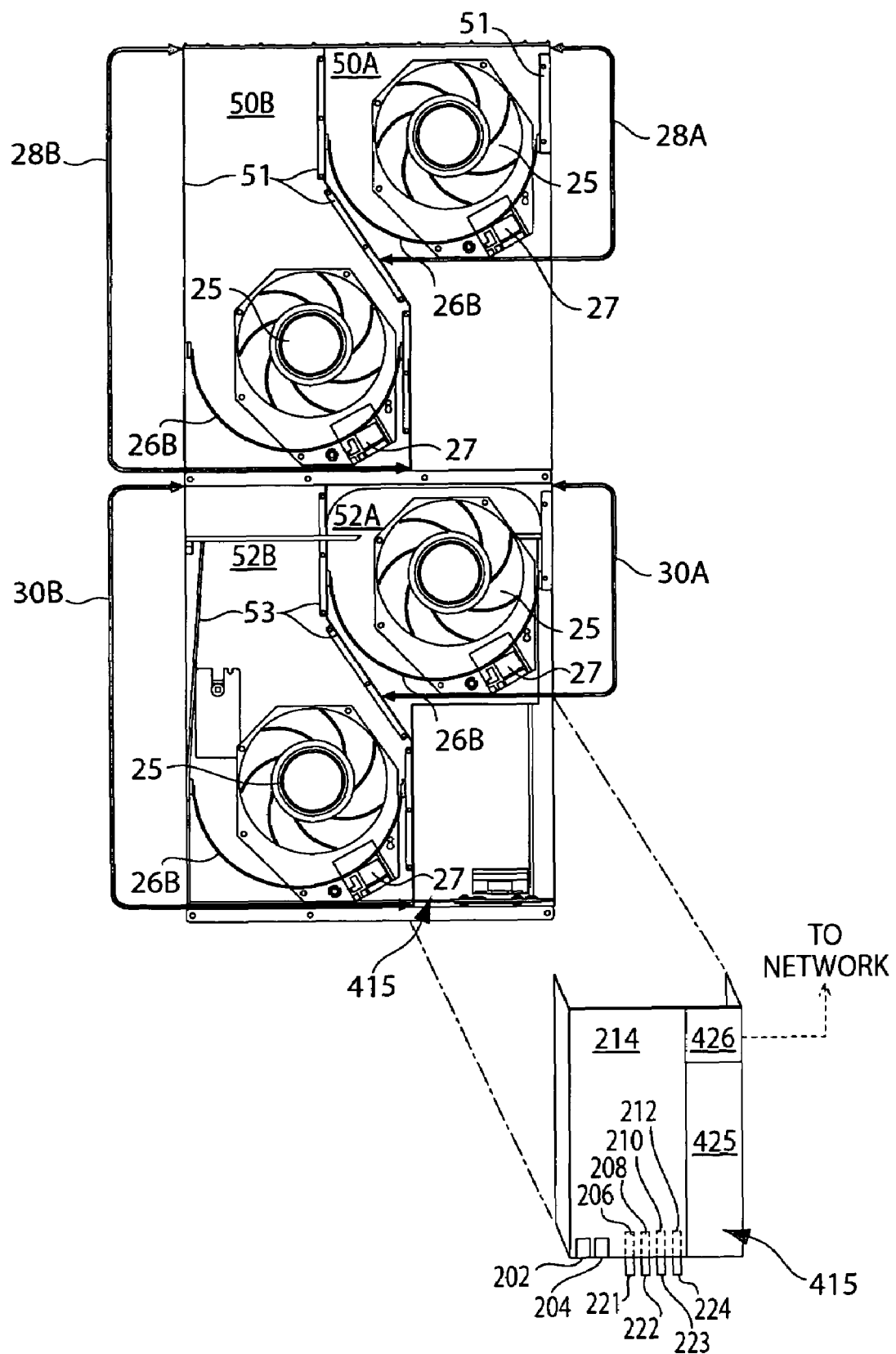
FIG. 3B is a view of the air intake side of the unit shown in FIG. 1 and FIGS. 2A and 2B with an upper and a lower back panel removed and each of the air intake inlet rings shown in FIGS. 2A and 2B removed therefrom.

Referring to FIGS. 3A and 3B, and with further reference to FIGS. 2A and 2B, the upper exhaust air module 24 is defined in part by an upper portion of the three-sided chassis housing 12 and includes a first upper fan module 28A coupled with a first internal air plenum 50A defined within the chassis housing 12. The upper exhaust air module 24 further includes a second upper fan module 28B coupled with a second internal air plenum 50B defined within the chassis housing 12. The upper exhaust module 24 further includes an upper back panel 21A configured to removably mount the fan modules 28A and 28B to the chassis housing 12. Each fan module 28A and 28B is configured and disposed to help to define and to connect with its respective air plenum 50A and 50B such that during operation of the unit 10, each fan module 28A and 28B draws-in exhaust air vented from rack-mounted equipment and each air plenum 50A and 50B receives drawn-in air vented from the fan module 28A and 28B.

As shown in FIGS. 3A and 3B, the fan modules 28A and 28B are adjacent one another along the axis of width X of the unit 10 and are disposed in an offset orientation relative to one another along the axis of height Y of the unit 10. In addition, the internal air plenums 50A and 50B are disposed adjacent one another within the interior of the upper exhaust air module 24.

As shown in FIG. 2B, the upper back panel 21A defines a port for each fan module 28A and 28B configured to receive and to mate with one of the fan modules 28A and 28B and to permit the fan module 28A and 28B to be removably connected to the back panel 21A. When the fan modules 28A and 28B are connected to the back panel 21A, the back panel 21A is mounted and connected to the three-sided chassis housing 12 to install the fan modules 28A and 28B and to define an upper portion of the air intake side of the chassis housing 12. Installation of the back panel 21A and the fan modules 28A and 28B to the housing 12 further defines each internal air plenum 50A and 50B of the upper exhaust module 24.

Thus, when assembled, the upper portion of the chassis housing 12, the upper fan modules 28A and 28B and their respective internal air plenums 50A and 50B and the upper back panel 21A collectively define the upper exhaust air module 24.

As shown in FIG. 3B, and as will be described in detail below, when installed to the housing 12, each fan module 28A and 28B couples with one or more internal walls 51 defined within the interior of the chassis housing 12 of the upper exhaust module 24 to help to define its respective air plenum 50A and 50B. The internal walls 51 are disposed and configured such that when each fan module 28A and 28B is connected to the back panel 21A and the back panel 21A is mounted to the upper portion of the housing 12, the fan module 28A and 28B, the one or more interior walls 51 and the back panel 21A collectively define its internal air plenum 50A and 50B. Each air plenum 50A and 50B is an individual plenum that defines a separate airflow path for fan-exhausted received from its respective fan module 28A and 28B. As shown in FIG. 3B, the upper air plenums 50A and 50B are adjacent one another along the axis of width X of the unit 10.

When the back panel 21A and the fan modules 28A and 28B are mounted to the housing 12, each air plenum 50A and 50B defines an interior volume sized and configured to receive and to contain air exhausted from its respective fan module 28A and 28B. In addition, the interior volume of each air plenum 50A and 50B provides an airflow path for fan-exhausted air that is separate and isolated from an airflow path provided by the interior volume of the adjacent air plenum 50A and 50B. Each air plenum 50A and 50B thereby accommodates the flow of fan-exhausted air without interference or resistance from the flow of fan-exhausted air through the adjacent plenum 50A and 50B. The interior volume of each air plenum 50A and 50B is further sized and configured to direct and to channel the fan-exhausted air through the upper exhaust module 24 away from the upper fan modules 28A and 28B to the exhaust vent 32 from which the fan-exhausted air vents.

As will be described in detail below, the configuration of the upper fan modules 28A and 28B and the air plenums 50A and 50B helps to define the motion and the path of exhaust air away from the upper fan modules 28A and 28B and through the air plenums 50A and 50B such that air turbulence and air resistance are minimized or reduced. Minimizing or reducing air turbulence and air resistance helps to achieve an optimal flow of exhaust air through the air plenums 50A and 50B, which thereby enhances the overall air-removal or exhaust capacity of the unit 10.

With further reference to FIGS. 2A and 2B and FIGS. 3A and 3B, the lower exhaust air module 26 is defined in part by the three-sided chassis housing 12 and includes a first lower fan module 30A coupled with a first internal air plenum 52A defined within the chassis housing 12. The lower exhaust air module 26 further includes a second lower fan module 30B coupled with a second internal air plenum 52B defined within the chassis housing 12. The lower exhaust module 26 further includes a lower back panel 21B configured to removably mount the lower fan modules 30A and 30B to the chassis housing 12. Each fan module 30A and 30B is configured and disposed to help to define and to connect with its respective air plenum 52A and 52B such that during operation of the unit 10, each fan module 30A and 30B draws-in exhaust air vented from rack-mounted equipment, and each air plenum 52A and 52B receives drawn-in air vented from the fan module 30A and 30B.

As shown in FIGS. 3A and 3B, the fan modules 30A and 30B are adjacent one another along the axis of width X of the unit 10 and are disposed in an offset orientation relative to one another along the axis of height Y of the unit 10. In addition, the internal air plenums 52A and 52B are disposed adjacent one another within the interior of the lower exhaust air module 26.

As shown in FIG. 2B, the lower back panel 21B defines a port for each fan module 30A and 30B configured to receive and to mate with one of the lower fan modules 30A and 30B. When the lower fan modules 30A and 30B are connected to the lower back panel 21B, the back panel 21B is mounted and connected to the three-sided chassis housing 12 to install the fan modules 30A and 30B and to define a lower portion of the air intake side of the chassis housing 12. Installation of the lower back panel 21B and the lower fan modules 30A and 30B to the housing 12 further defines each internal air plenum 52A and 52B of the lower exhaust module 26.

Thus, when assembled, the lower portion of the chassis housing 12, the lower fan modules 30A and 30B and their respective internal air plenums 52A and 52B and the lower back panel 21B collectively define the lower exhaust air module 26.

As shown in FIG. 3B, and as will be described in detail below, when installed to the housing 12, each lower fan module 30A and 30B couples with one or more internal walls 53 defined within the interior of the chassis housing 12 of the lower exhaust module 26 to help to define its respective air plenum 52A and 52B. Similar to the upper exhaust module 24, the internal walls 52 of the lower exhaust module 26 are disposed and configured such that when each lower fan module 30A and 30B is connected to the lower back panel 21B and the lower back panel 21A is mounted to the lower portion of the housing 12, the lower fan module 30A and 30B, the one or more interior walls 52 and the lower back panel 21B collectively define its internal air plenum 52A and 52B. Each air plenum 52A and 52B is an individual plenum that defines a separate airflow path for fan-exhausted received from its respective fan module 28A and 28B. As shown in FIG. 3B, the lower air plenums 52A and 52B are adjacent one another along the axis of width X of the unit 10.

Similar to the upper exhaust module 24, when the lower back panel 21A and the lower fan modules 30A and 30B are mounted to the lower portion of the housing 12, each air plenum 52A and 52B defines an interior volume sized and configured to receive and to contain air exhausted from its respective fan module 30A and 30B. In addition, the interior volume of each air plenum 52A and 52B provides an airflow path for fan-exhausted air that is separate and isolated from an airflow path provided by the interior volume of the adjacent air plenum 52A and 52B. Each air plenum 52A and 52B thereby accommodates the flow of fan-exhausted air without interference or resistance from the flow of fan-exhausted air through the adjacent plenum 50A and 50B. The interior volume of each air plenum 52A and 52B is further sized and configured to direct and to channel the fan-exhausted air away from the lower fan modules 30A and 30B to the exhaust vent 32 from which the fan-exhausted air vents.

As will be described in detail below, the configuration of the lower fan modules 30A and 30B and the air plenums 52A and 52B helps to define the motion and the path of exhaust air away from the lower fan modules 30A and 30B and through the air plenums 52A and 52B such that air turbulence and air resistance are minimized or reduced within the air plenums 52A and 52B. As mentioned above, minimizing or reducing air turbulence and air resistance helps to achieve an optimal flow of exhaust air through the air plenums 52A and 52B, which thereby enhances the overall air-removal or exhaust capacity of the unit 10.

Figure 4:
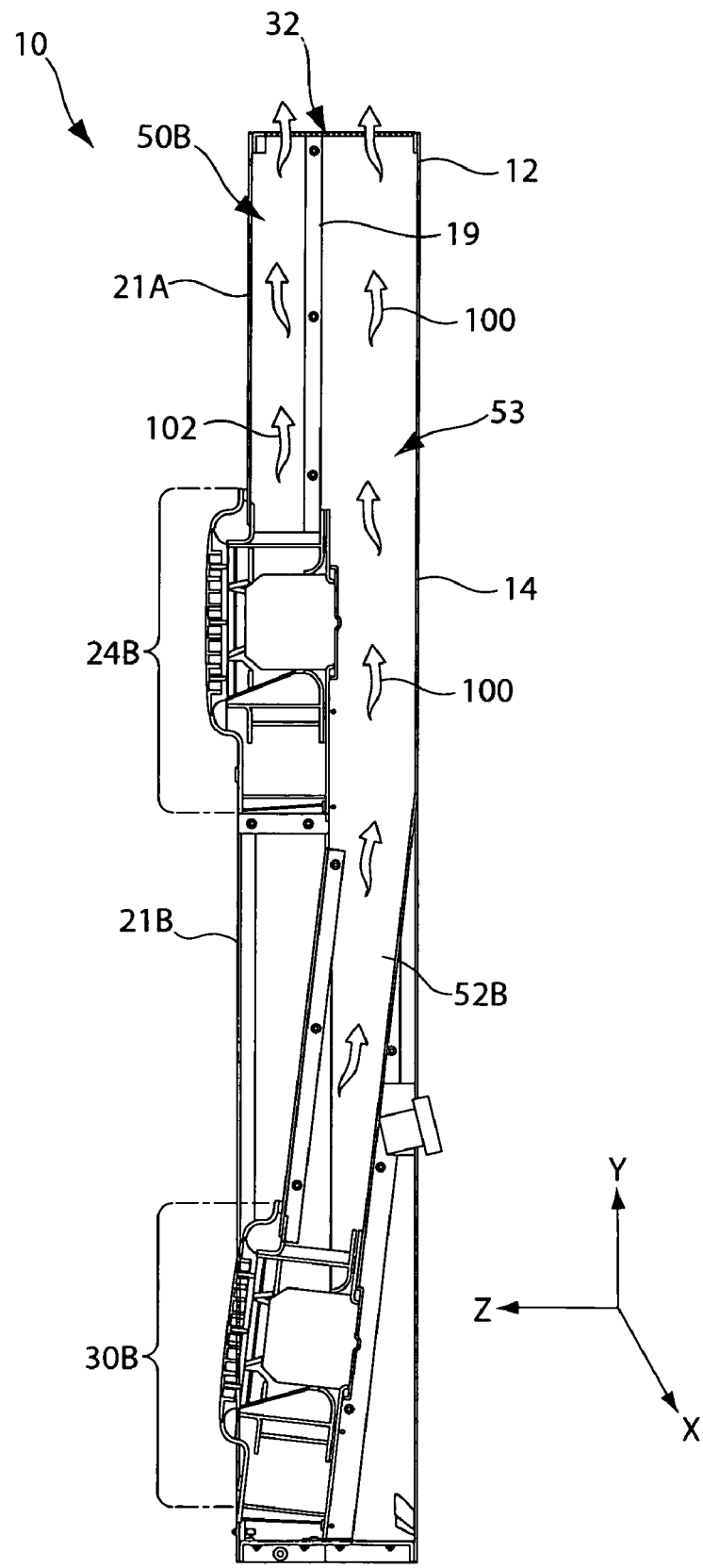
FIG. 4 is a cross-sectional side view of the unit shown in FIGS. 2A and 2B.

Referring to FIG. 4, and with further reference to FIGS. 2A and 2B and FIGS. 3A and 3B, a cross-sectional side view of the housing 12 illustrates the stacked configuration of the upper and lower exhaust modules 24 and 26 along the axis of depth Z of the unit 10. In addition, as best shown in FIGS. 3A and 4, the lower fan modules 30A and 30B are disposed in an offset orientation relative to the upper fan modules 28A and 28B along the depth Z of the unit 10. Further, as best shown in FIG. 4, the lower fan modules 30A and 30B are further disposed at an angled orientation relative to the upper fan modules 28A and 28B. FIG. 4 further illustrates the internal air plenums 50A, 50B and 52A, 52 are separate individual plenums.

The stacked configuration of the exhaust modules 24 and 26 helps to separate the upper fan modules 28A and 28B from the lower fan modules 30A and 30B, and further helps to facilitate the offset orientation of the fan modules 28A, 28B and 30A, 30B. The stacked configuration of the exhaust modules 24 and 26 also helps to incorporate multiple fans into the unit 10 to achieve a desired high airflow capacity while minimizing the height or vertical distance Y of the unit 10 required to house multiple fans, thereby maintaining the compact and portable design of the unit 10. In addition, the offset and angled orientation of the fan modules 28A, 28B and 30A, 30B further helps to minimize the height or vertical distance Y of the unit 10. Further, the stacked configuration of the exhaust modules 24 and 26, and the offset and angled orientation of the fan modules 28A, 28B and 30A, 30B, help to separate and outwardly orient each fan module 28A, 28B and 30A, 30B away from the back panel 21A and 21B without obstruction or interference from adjacent fan modules 28A, 28B and 30A, 30B.

With further reference to FIG. 4, the lower exhaust module 26 further includes an offset air plenum 53 defined within the housing 12 behind the upper exhaust module 24. The offset air plenum 53 is defined by the front panel 14 and the side walls 16 and 18 of the housing 12 and an interior wall 19 disposed within the housing 12 that extends vertically behind the upper exhaust module 24 and terminates into the exhaust vent 32. As shown in FIG. 4, the lower air plenums 52A and 52B terminate into the offset air plenum 53 such that during operation of the unit 10, the offset air plenum 53 receives fan-exhausted air from the lower air plenums 52A and 52B. As shown by arrows 100 in FIG. 4, the offset air plenum 53 receives fan-exhausted air from the lower air plenums 52A and 52B and channels the air away from the lower air plenums 52A and 52B to the exhaust vent 32. In addition, as shown by arrows 102 in FIG. 4, the upper air plenums 50A and 50B receive fan-exhausted air from the upper fan modules 28A and 28B and channel the air away from the upper fan modules 28A and 28B to the exhaust vent 32.

The configurations of the upper and lower air plenums 50A, 50B and 52A, 52B and 53, as well as the stacked configuration of the exhaust modules 24 and 26 and the offset orientation of the fan modules 28A, 28B and 30A, 30B, thereby provide four separate exhaust airflow paths within the unit 10, each dedicated to its respective fan module. When the unit 10 is assembled, the upper and lower fan modules 28A, 28B and 30A, 30B and the internal air plenums 50A, 50B and 52A, 52B are constructed and arranged such that minimal or substantially no exhaust air, e.g., less than about ten percent (10%) or an insubstantial volume of exhaust air, leaks from the air plenums 50A, 50B and 52A, 52B and/or the unit 10 before exhaust air is channeled through the plenums 50A, 50B and 52A, 52B to the exhaust port 32. By containing and channeling exhaust air, the unit 10 helps to isolate hot and warm exhaust air such that exhaust air may be removed from the rack or enclosure and thereafter vented to an area external to the rack or equipment. As will be described in detail below, the unit 10 is constructed and arranged to provide portability and flexibility with respect to incorporating the unit 10 with an air exhaust system and/or an air conditioning system associated with an equipment room or data center.

In addition, by containing and channeling exhaust air, the unit 10 helps to prevent or minimize the extent of exhaust air mixing with available cooling air. The unit 10 thereby facilitates conditions within a rack or enclosure, and/or within an equipment room or data center, for supplying sufficient cooling air, e.g., ambient or cooled air circulating in an equipment room or data center, at a desired temperature from which rack-mounted equipment draw to meet cooling requirements.

Figure 5A:
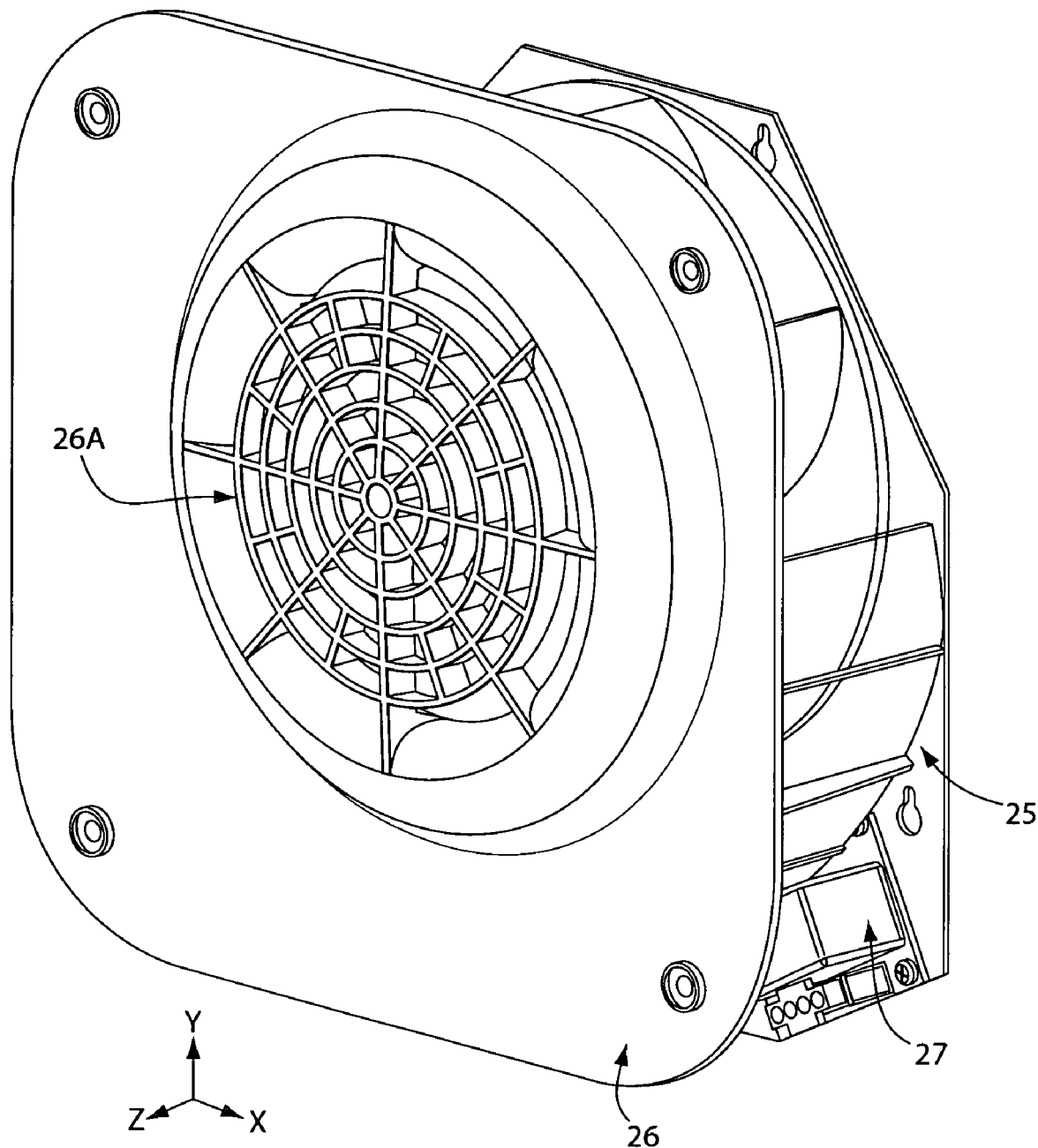
FIG. 5A is a front perspective view of an air intake side of the air intake inlet ring shown in FIGS. 2A and 2B attached to a fan.
Figure 5B:
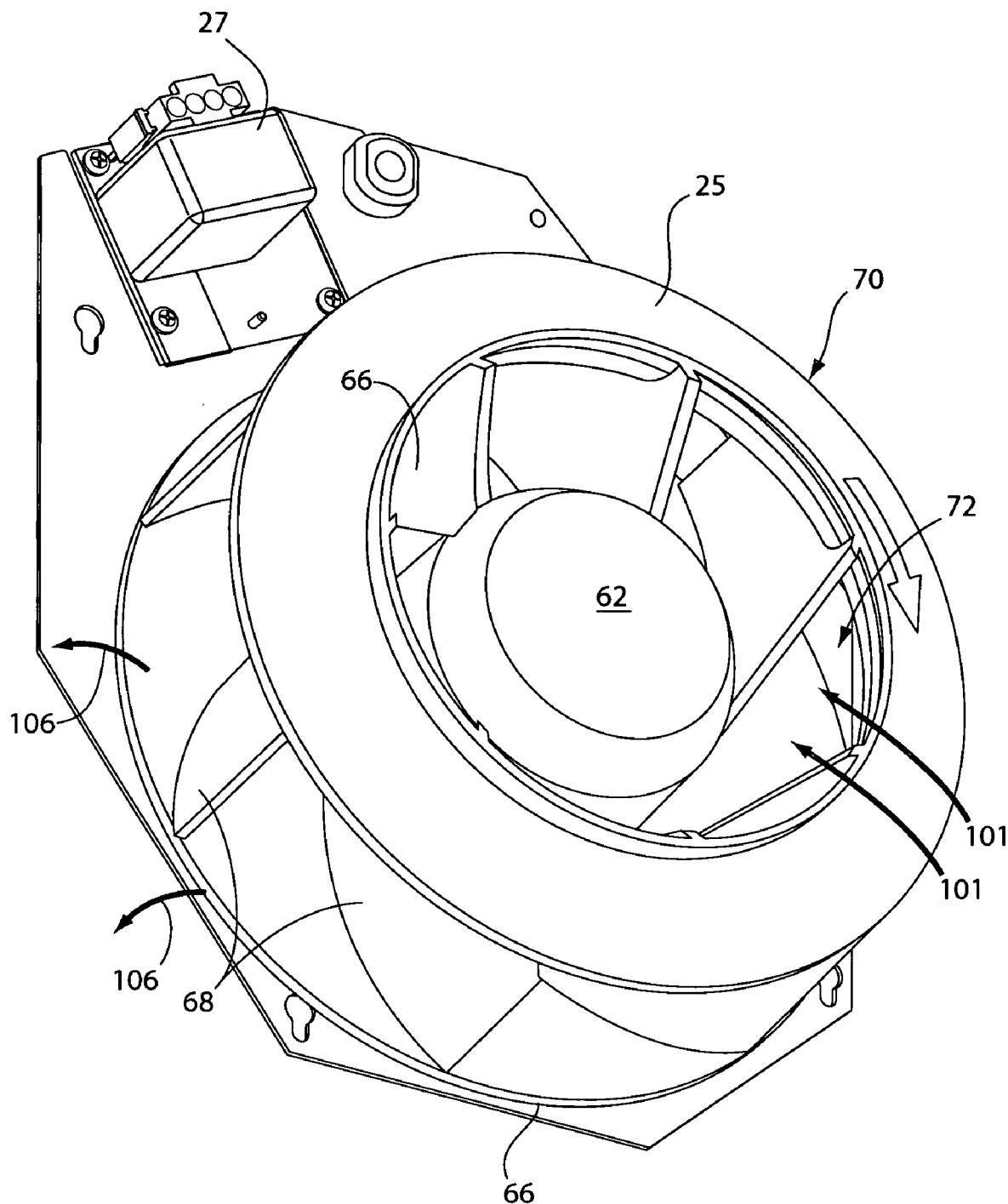
FIG. 5B is a front perspective view of the air intake side of the fan shown in FIG. 5A with the air intake inlet ring removed therefrom.
Figure 5C:
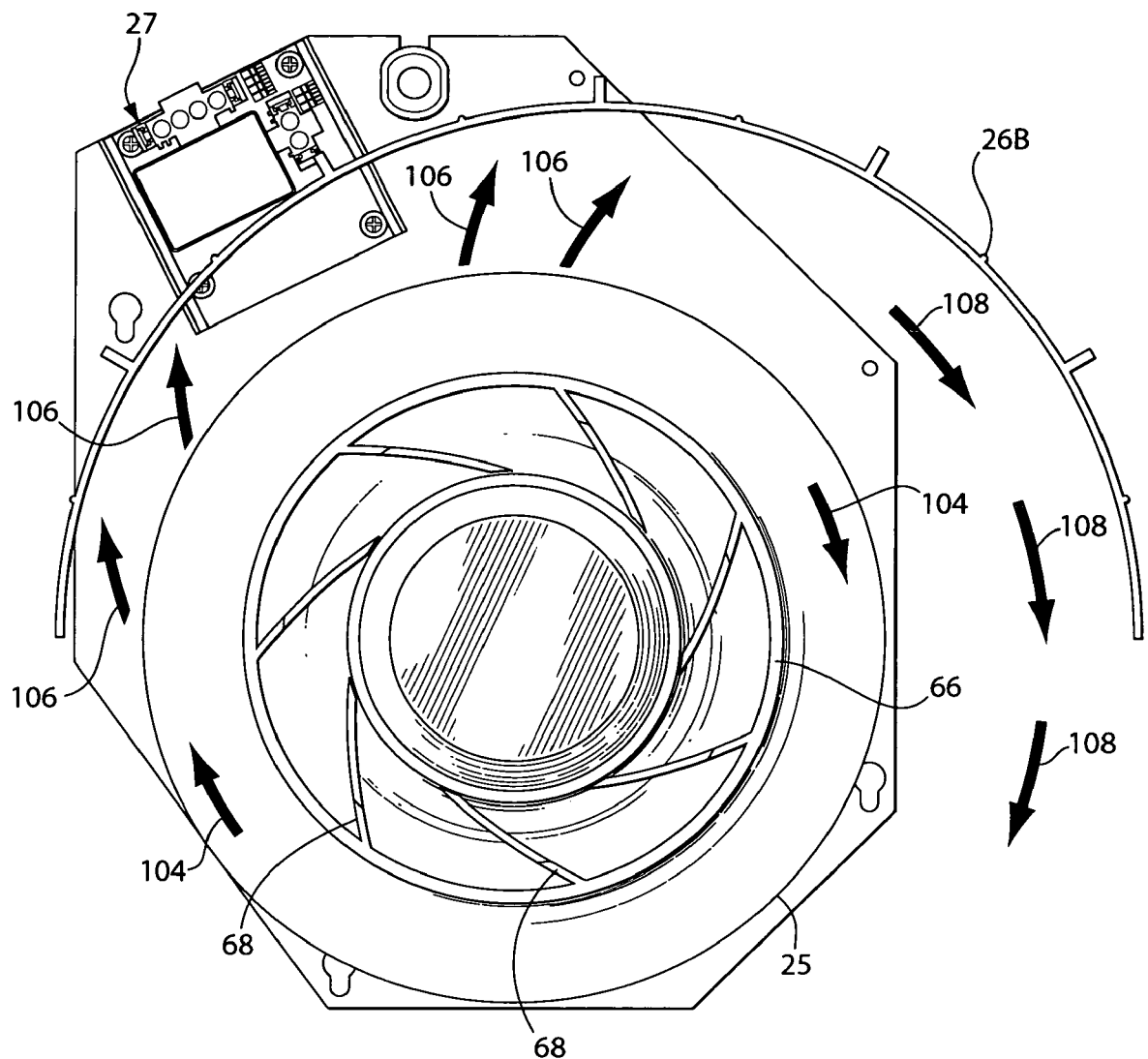
FIG. 5C is a back view of the fan shown in FIG. 5B with the air intake inlet ring attached thereto.

Referring to FIGS. 5A-5C, and with further reference to FIGS. 2B and 3B, each fan module 28A, 28B and 30A, 30B includes a fan 25, an air intake inlet ring 26 and a monitoring/control electronics module 27, e.g., including fan speed control electronics, that helps to monitor and/or control any of a variety of operating parameters of the fan modules 28A, 28B and 30A, 30B and/or the unit 10. As shown in FIG. 2B, each of the upper and the lower back panels 21A and 21B defines two ports 48. Each port 48 is configured to receive and to mate with one of the fan modules 28A, 28B and 30A, 30B. The position of each port 48 helps to arrange each fan module 28A, 28B and 30A, 30B adjacent one another in an offset orientation relative to the other fan module along the axis of width X of the unit 10, and further helps to orient the upper fan modules 28A and 28B in an offset position relative to the lower fan modules 30A and 30B. The area each port 48 defines is configured and sized to receive and to mate with the fan 25 and the air intake inlet ring 26, as shown in FIG. 2B. Each fan module 28A, 28B and 30A, 30B is disposed over its port 48 such that an air intake side 70 of the fan 25 is exposed and oriented outwardly away from the back panel 21A and 21B. The fan 25 and the inlet ring 26 are removably connected to the back panel 21A and 21B using any type of connectors, e.g., screws, nut/bolt combinations or the like, suitable for removably securing the fan 25 and the inlet ring 26 to the back panel 21A and 21B. Removably connecting the fans 25 and the inlet rings 26 to the back panel 21A and 21B facilitates in-field maintenance, service and replacement of the fans 26, the inlet rings 26 and the electronics 27 associated with each fan 25 when the unit 10 is installed to an equipment rack or enclosure and during operation of the unit 10.

When the unit 10 is installed to an equipment rack or enclosure, the air intake side 70 of each fan 25 is in facing relation to the exhaust side of the rack or enclosure and is in fluid communication with areas along the rack or equipment into which rack-mounted equipment vent exhaust air. During operation of the unit 10, each fan 25 draws air from the exhaust side of a rack or enclosure along its air intake side 70 into an internal region 72 of the fan 25, as shown by arrows 101 in FIG. 5B. Each fan 25 is disposed over its respective port 48, and is constructed and arranged to induce radially outward airflow, as shown by arrows 106 in FIGS. 5B and 5C. The fan 25 rotates about a hub including a fixed top portion 62 and a rotating lower portion (not shown), and includes a ring 66 of impellers, blades or fins 68, as shown in FIGS. 5B and 5C, into which the fan 25 draws air. Each fan 25 includes, but is not limited to, a fan with motorized impellers, e.g., backward curved impellers, or an axial type fan, such as those fans manufactured by EBM Industries, Inc. of Farmington, Conn. and Fanstech, Inc. of China (although numerous other types of fans are acceptable and can be used for the fans 25 of the fan modules 28A, 28B and 30A, 30B).

The ring 66 of impellers, blades and/or fins 68 is angled relative to a radial direction of the fan 25 such that the rotation of the ring 66 caused by a fan motor or the control electronics 27 will draw air through the inlet ring 26 and the port 48 into the internal region 72 of the fan 25 that is in fluid communication with a rack or enclosure 110. The rotation of each fan 25 forces drawn-in air radially outward from the fan's internal region 72, as shown by arrows 106 in FIGS. 5B and 5C. Each ring 66 is configured such that the internal region 72 of each fan 25 spans an area at least as large as the area which the port 48 spans such that air will flow only or substantially only into the fan 25 and through the port 48.

Each fan 25 has a flow capacity to provide an airflow rate, e.g., cubic feet per minute (cfm) of air, sufficient to help the unit 10 according to the invention accommodate or manage the thermal output of equipment components mounted in a rack or enclosure to which the unit 10 is installed. Each fan 25 is preferably constructed and disposed in the unit 10 to draw exhaust air vented from either standard information technology (IT) equipment or a mix of equipment including, for instance, blade servers and standard servers or blade servers alone.

For instance, each fan 25 can have an airflow capacity of from about 500 cfm to about 800 cfm. With a typical server producing a thermal output of about 8 cfm to about 25 cfm of exhaust air, each fan 25 can draw and vent exhaust air into its respective air plenum 50A, 50B and 52A, 52B and through the exhaust port 32 at the top of the unit 10 at a capacity of, e.g., up to about 2,000 cfm. The unit 10 thereby helps to accommodate or manage the thermal output of up to about 16.5 kW, e.g., produced from a blade or legacy server rack.

In other rack arrangements that house different numbers of equipment components as well as different types of equipment that produce higher or lower thermal outputs, the airflow capacity of the fans 25 can be adjusted to help the unit 10 manage a given thermal output. The unit 10 according to the invention has sufficient flexibility with respect to the construction and arrangement of the fan modules 28A, 28B and 30A, 30B such that the fans 25 and/or the fan modules 28A, 28B and 30A, 30B can be easily and readily replaced and/or serviced in the field in order to change the airflow capacity (cfm) of one or more fans 25 and the unit 10. The invention is not limited in this respect and envisions that the air removal unit 10 can be altered or modified to adjust the airflow capacity and thereby the air removal or exhaust capacity of the unit 10 in response to a given thermal output of a rack or enclosure.

The fans 25 have variable speeds that affect the airflow rate each fan 25 may achieve during operation of the unit 10. For instance, the fans 25 have either multiple, fixed-step speeds or substantially variable speeds. An operating speed of the fan 25 may be set prior to operation and maintained at a substantially consistent speed. Alternatively, or additionally, an operating speed of the fan 25 may be set prior to operation and thereafter adjusted in response to operation parameters and/or environmental conditions that an interactive programmable controller 425 of the unit 10, as described below with reference to FIG. 8, detects and/or measures. Suitable voltage is applied to each fan 25 to set and to adjust the fan's 25 speed to thereby control the airflow rate the fan 25 produces. As mentioned, fan speed may be adjusted, for instance, in response to detection and/or measurement of one or more operating parameters, e.g., related to the unit 10 or the equipment components mounted within a rack or enclosure to which the unit 10 is installed, and/or one or more environmental conditions, e.g., associated with the interior of the rack or enclosure or the equipment room or data center in which the rack or enclosure is located.

As shown in FIG. 3B and FIGS. 5B and 5C, each fan module 28A, 28B and 30A, 30B further includes the monitoring/control electronics module 27 that may include fan speed control electronics, as well as other electronics for monitoring and/or controlling any of a variety of operation parameters of the fan modules 28A, 28B and 30A, 30B. The electronics module 27 is preferably removably connected to the fan 25 and/or the fan module 28A, 28B and 30A, 30B in order to facilitate installation and in-field maintenance, service and replacement of the electronics module 27.

With respect to the air intake ring 26 of each fan module 28A, 28B and 30A, 30B, the inlet ring 26 includes a face plate, as shown in FIGS. 2B and 5A, defining a fan grill or finger guard 26A along an outer surface that is disposed in facing relation to the exhaust side of an equipment rack or enclosure when the unit 10 is assembled and installed to an equipment rack or enclosure. The fan grill or finger guard 26A is configured to permit air to enter the fan 25 along the air intake side 70 of the fan 25 during operation of the fan 25, while preventing debris or an operator's hand or fingers from entering the fan 25.

As shown in FIGS. 2B, 3B and 5C, the air intake inlet ring 26 further includes a semicircular wall 26B that extends outwardly from an inner surface of the inlet ring 26. The semicircular wall 26B is disposed in facing relation to the interior of the housing 12 when the inlet ring is connected to the back panel 21A and 21B and the unit 10 is assembled.

As described above, when the fan modules 28A, 28B and 30A, 30B are connected to their respective back panels 21A and 21B, and the back panels 21A and 21B are mounted to the housing 12 to assemble the unit 10, each fan module 28A, 28B and 30A, 30B helps to define its respective air plenum 50A, 50B and 52A, 52B. More particularly, the semicircular wall 26B of each inlet ring 26 of each fan module 28A, 28B and 30A, 30B essentially couples with one or more of the interior walls 51 and 53 defined within the housing 12 to thereby help to define each air plenum 50A, 50B and 52A, 52B. The semicircular wall 26B and the one or more interior walls 51 and 53 help to define each internal air plenum 50A, 50B and 52A, 52B as a separate and substantially enclosed air plenum 50A, 50B and 52A, 52B that extends away from its respective fan module 28A, 28B and 30A, 30B and terminates into the exhaust vent 32 at the top of the housing 12. FIG. 3B best illustrates the position and the configuration of the inlet ring 26 when the fan modules 28A, 28B and 30A, 30B are connected to the housing 12. The inlet ring 26, or, more specifically, the semicircular wall 26B, couples with one or more interior walls 51 and 53 to help to define a lower portion of each air plenum 50A, 50B and 52A, 52B. The air intake inlet ring 26 and its semicircular wall 26A thereby help each fan module 28A, 28B and 30A, 30B define its respective air plenum 50A, 50B and 52A, 52B as a separate airflow path extending away from the fan module.

With further reference to FIG. 5C, when the fan module 28A, 28B and 30A, 30B with the air intake inlet ring 26 are assembled and mounted to the unit 10, the inlet ring 26 further serves to help to define the airflow path and the motion of air each fan 25 exhausts into its air plenum 50A, 50B and 52A, 52B. As shown in FIG. 5C, the configuration and depth of the semicircular wall 26B of the inlet ring 26 helps to define the airflow path and the motion of fan-exhausted air such that fan-exhausted air is directed to flow away from the fan 25. In this case, the fan 25 rotates in a clockwise direction, as shown by arrows 104 in FIG. 5C. The semicircular wall 26B helps to define an airflow path adjacent the fan 25 that increases, e.g., in a clockwise direction, as it extends away from the fan 25. The semicircular wall 26B is disposed and configured to collect fan-exhausted air, as shown by the arrows 106 in FIG. 5C, and to direct the motion of fan-exhausted air along the expanding airflow path, as shown by arrows 108 in FIG. 5C. In this manner, the inlet ring 26 helps to define an optimal airflow path for fan-exhausted air within each air plenum 50A, 50B and 52A, 52B and helps to direct the motion and flow of fan-exhausted air such that air turbulence and airflow resistance along the airflow path and through the air plenums 50A, 50B and 52A, 52B is minimized or reduced.

Figure 6A:
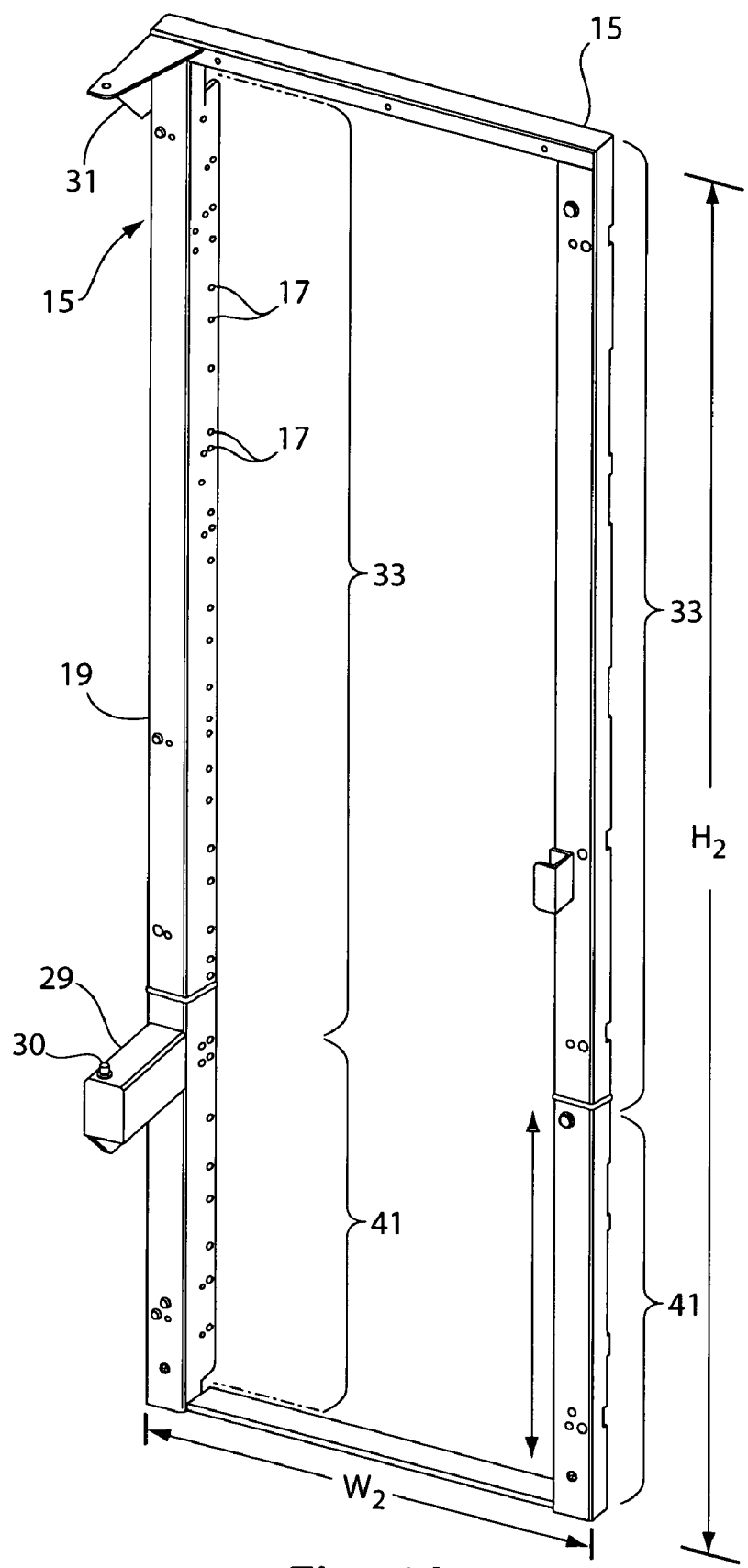
FIG. 6A is a front perspective view of a frame assembly according to the invention.
Figure 6B:
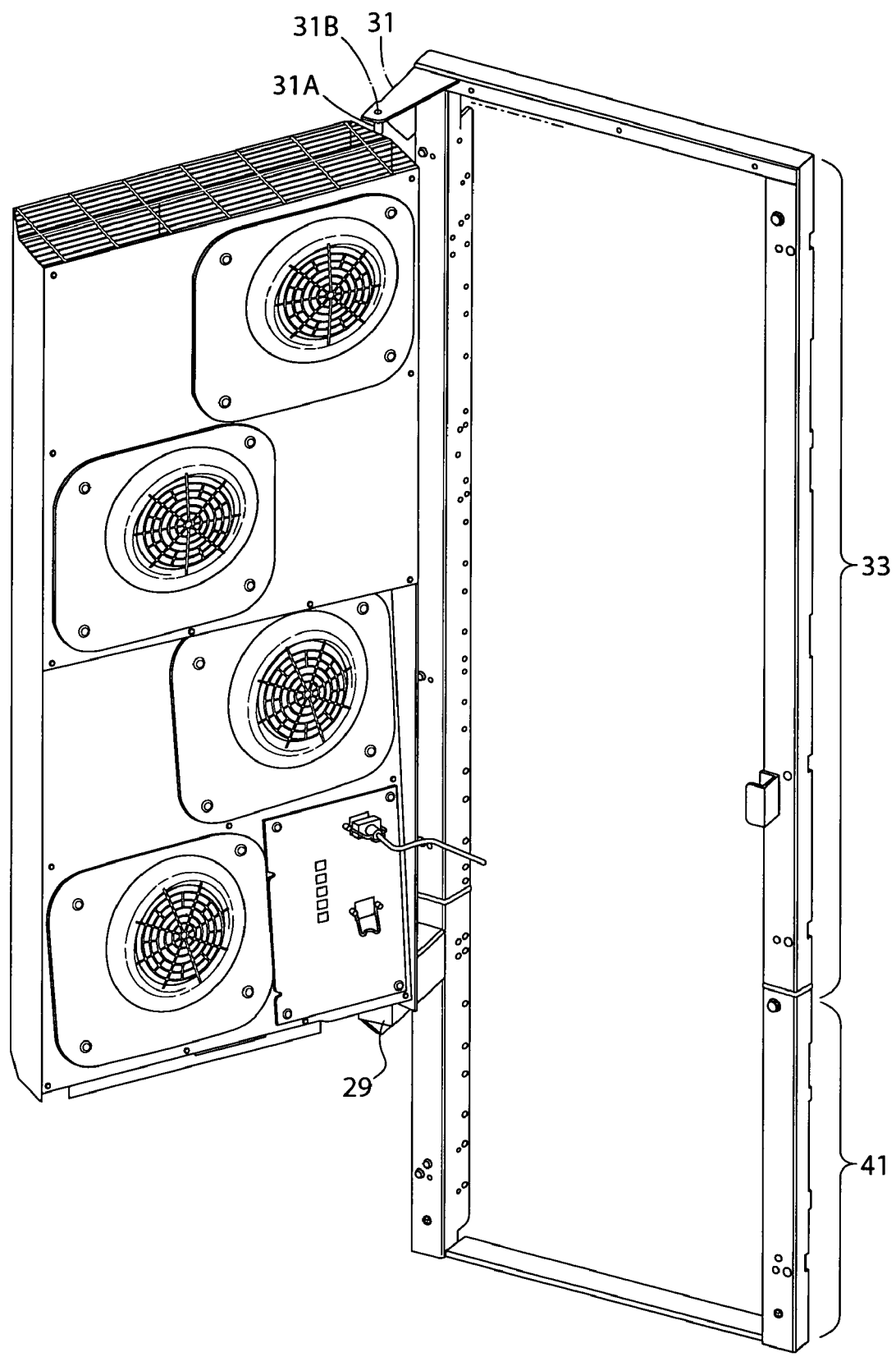
FIG. 6B is a front perspective view of the frame assembly shown in FIG. 6A with the unit shown in FIG. 1 and FIGS. 2A and 2B attached thereto and disposed in an open position.
Figure 6C:
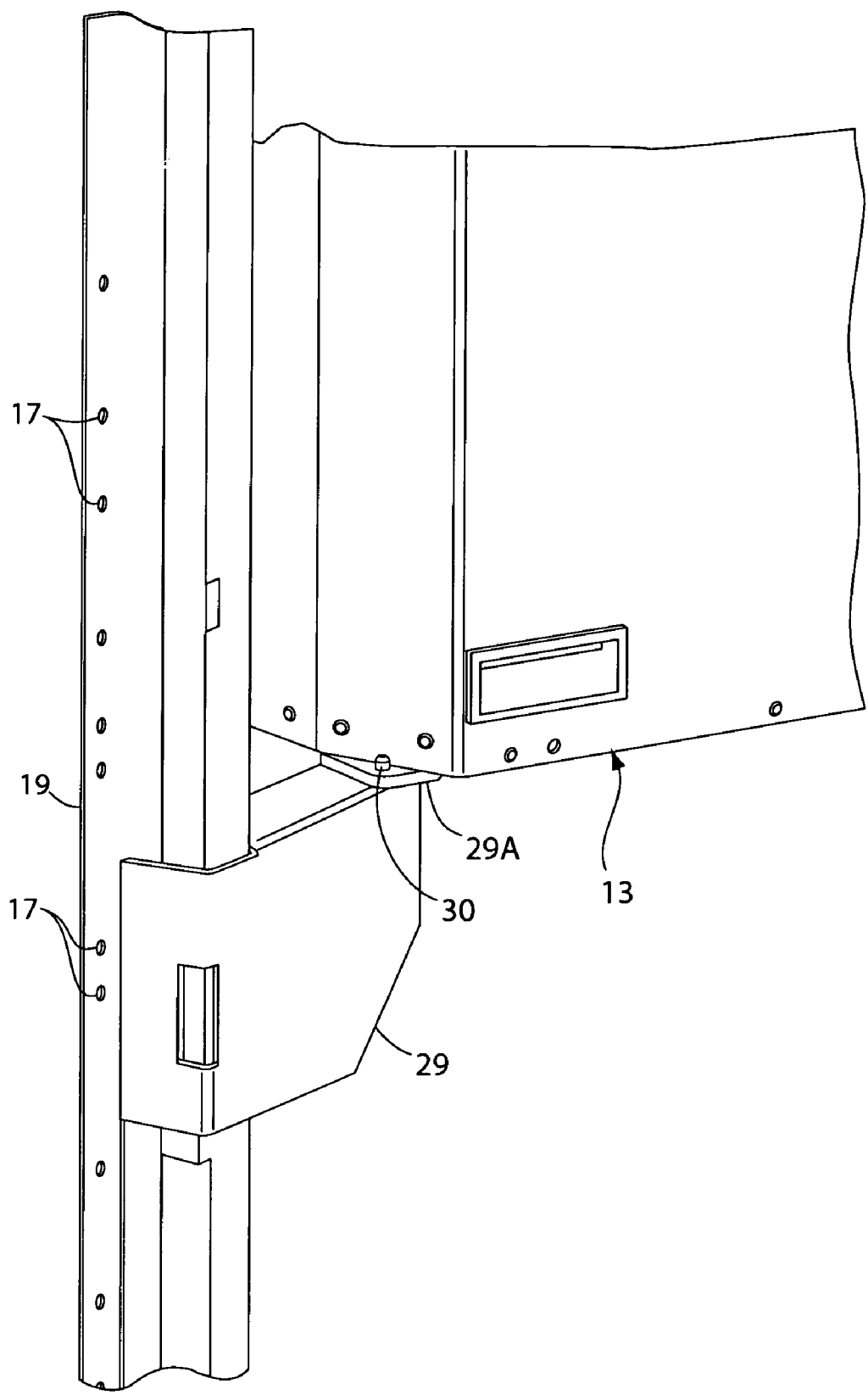
FIG. 6C is a front perspective view of a portion of the frame assembly and a portion of the unit as shown in FIG. 6B; (attached thereto)

Referring to FIGS. 6A-6C, and with further reference to FIGS. 1 and 2A and 2B, the unit 10 is constructed and arranged to mount or install to an equipment rack or enclosure via a frame assembly 15. The frame assembly 15 is constructed and arranged to mount or install directly to a number of different types of equipment racks or enclosures, and to receive and secure the unit 10 to the exhaust side of a rack or enclosure. In addition, the frame assembly 15 is further constructed and arranged to permit installation of the unit 10 to a number of different racks or enclosures having different U heights. The frame assembly 15 includes a pair of adjacent parallel telescoping longitudinal members that help to define the frame assembly 15 including upper members 33 and lower members 41. The upper members 33 and the lower members 41 are coupled to one another in such a manner that permits either the upper or the lower members 33 and 41 to telescopically receive the other members 33 and 41 such that the other members slide within the receiving members to thereby extend or shorten the vertical height of the frame assembly 15. The members 33 and 41 are configured to slide or telescope with respect to each other in certain increments, e.g., wherein the increments are defined in U units including 1U increments, 2U increments or more, in order to readily extend or retract the members 33 and 41 to accommodate the height of a rack or enclosure. The frame assembly 15 is thereby adjustable with respect to its height wherein the telescopically sliding upper and lower members 33 and 41 extend or retract to adjust the vertical length of the frame assembly 15 to accommodate the U height of a given rack or enclosure. In addition, the upper and the lower members 33 and 41 are further constructed and arranged to permit height adjustment while maintaining the structural strength of the frame assembly 15.

As shown in FIGS. 6A and 6C, the upper and the lower members 33 and 41 of the frame assembly 15 further include multiple openings or bores 17 defined along the vertical length of the upper and lower members 33 and 41. The multiple openings or bores 17 are disposed and configured to align with openings or bores defined along each side of an equipment rack or enclosure, as shown in FIG. 6F, or defined along side rails of the rack, and to receive connectors, e.g., screws, nut/bolt combinations and the like, suitable for mounting the frame assembly 15 to the rack or enclosure. During installation of the frame assembly 15 to an equipment rack, the multiple openings or bores 17 align with the openings or bores of the rack rails or the enclosure such that the aligned openings or bores of the frame assembly 15 and the rack rails each or the enclosure receive a connector, e.g., screw, to thereby securely and removably connect the frame assembly 15 to the rack or enclosure. The height of the frame assembly 15 can be adjusted before or after installation to the rack or enclosure. Once secured to the rack or enclosure, the frame assembly 15 may then receive and constrain the unit 10 such that the unit 10 is securely and removably connected to the rack.

As shown in FIGS. 6A-6C, a side wall 19 of the frame assembly 15 includes a lower hinge support 29 with a mounting pin 30 and an upper hinge receiving plate 31, each disposed along a vertical edge of the frame assembly 15. The lower hinge support 29, the mounting pin 30 and the upper hinge receiving plate 31 are constructed and arranged to mate to and to connect with complementary hinge means 29A and 31A disposed at corresponding positions along the left side wall 18 of the unit 10. The chassis housing 12 of the unit 10 is placed on the hinge support 29 with the mounting pin 30 mating to a complementary hinge plate 29A connected or mounted to the bottom plate 13 or the side wall 18 of the housing 12. The hinge plate 29A is configured to receive the mounting pin 30 of the lower hinge support 29 to thereby securely mount the lower portion of the housing 12 to the frame assembly 15. The uppermost portion or the top of the housing 12 is tipped into place such that the upper hinge receiving plate 31 of the frame assembly 15 aligns with a complementary hinge pin receptacle 31A disposed along the upper portion of the housing side wall 18. As shown in FIG. 6B, a hinge pin 31B is installed into a bore or opening of the upper hinge receiving plate 31 that aligns with the complementary hinge pin receptacle 31A to thereby securely mount and constrain the housing 12 to the frame assembly 15.

Figure 6D:
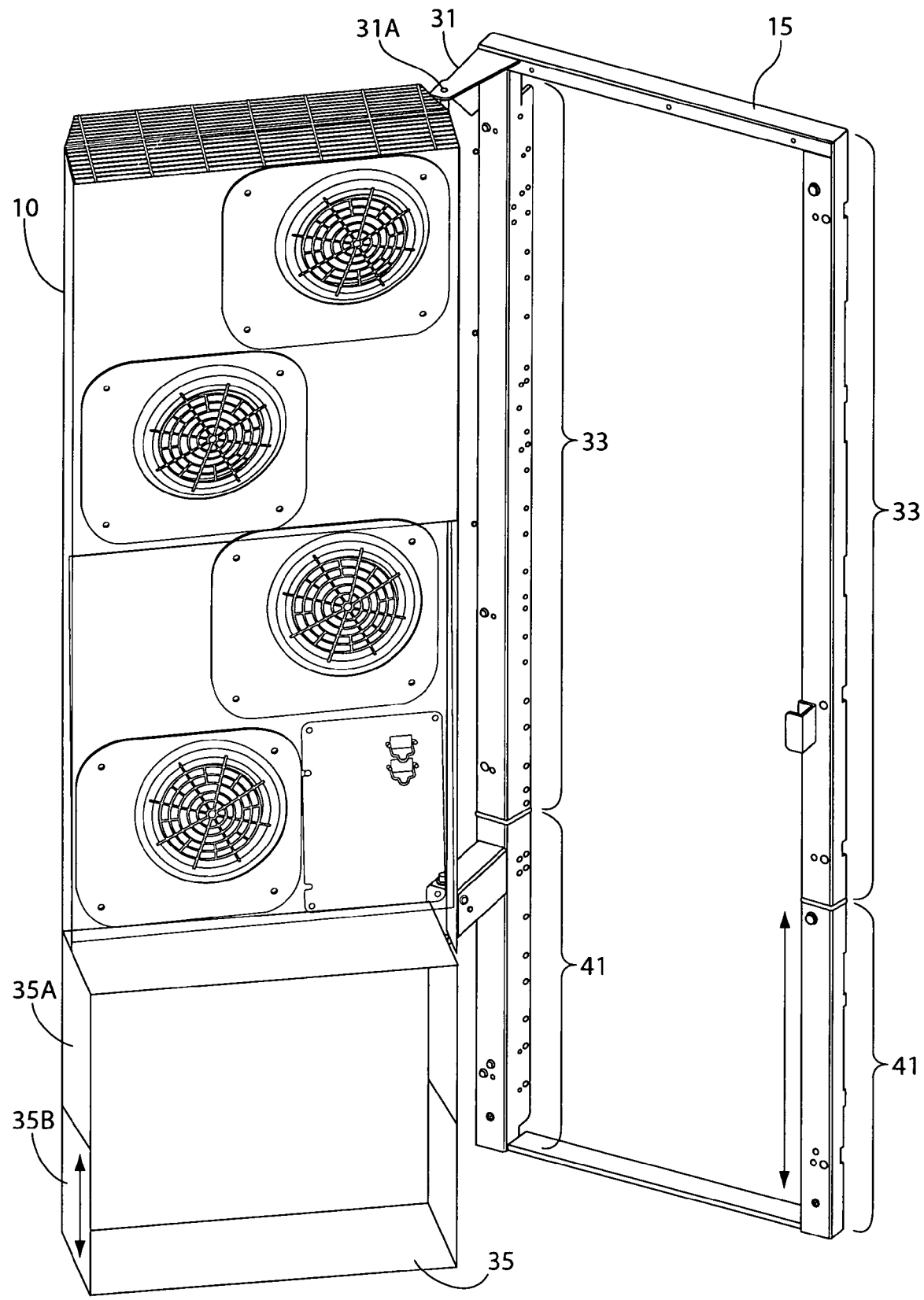
FIG. 6D is a front perspective view of the frame assembly and the unit shown in FIG. 6B with a blanking panel attached to the unit.
Figure 6E:
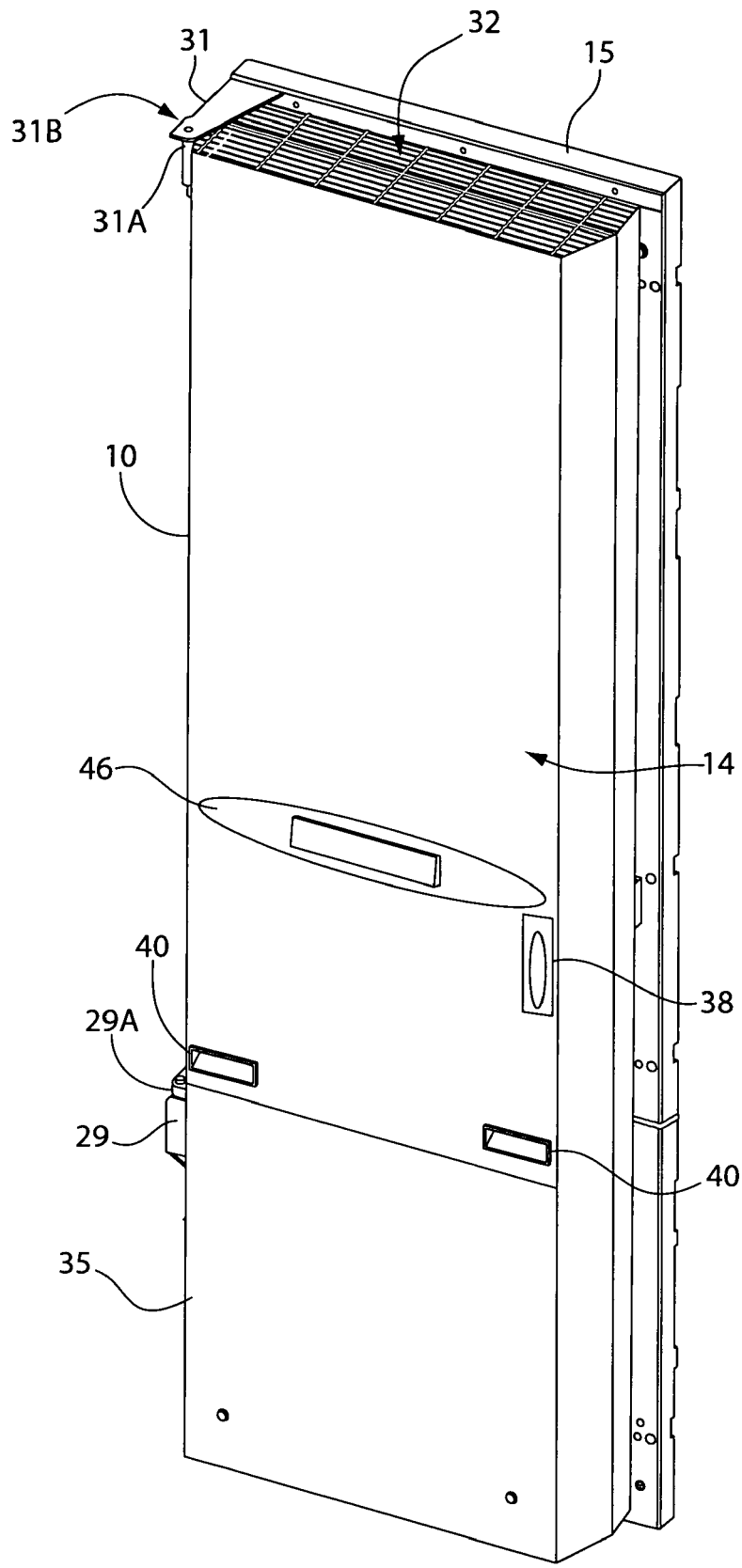
FIG. 6E is a front perspective view of the frame assembly and the unit shown in FIGS. 6B and 6D with the unit disposed in a close position.
Figure 6F:
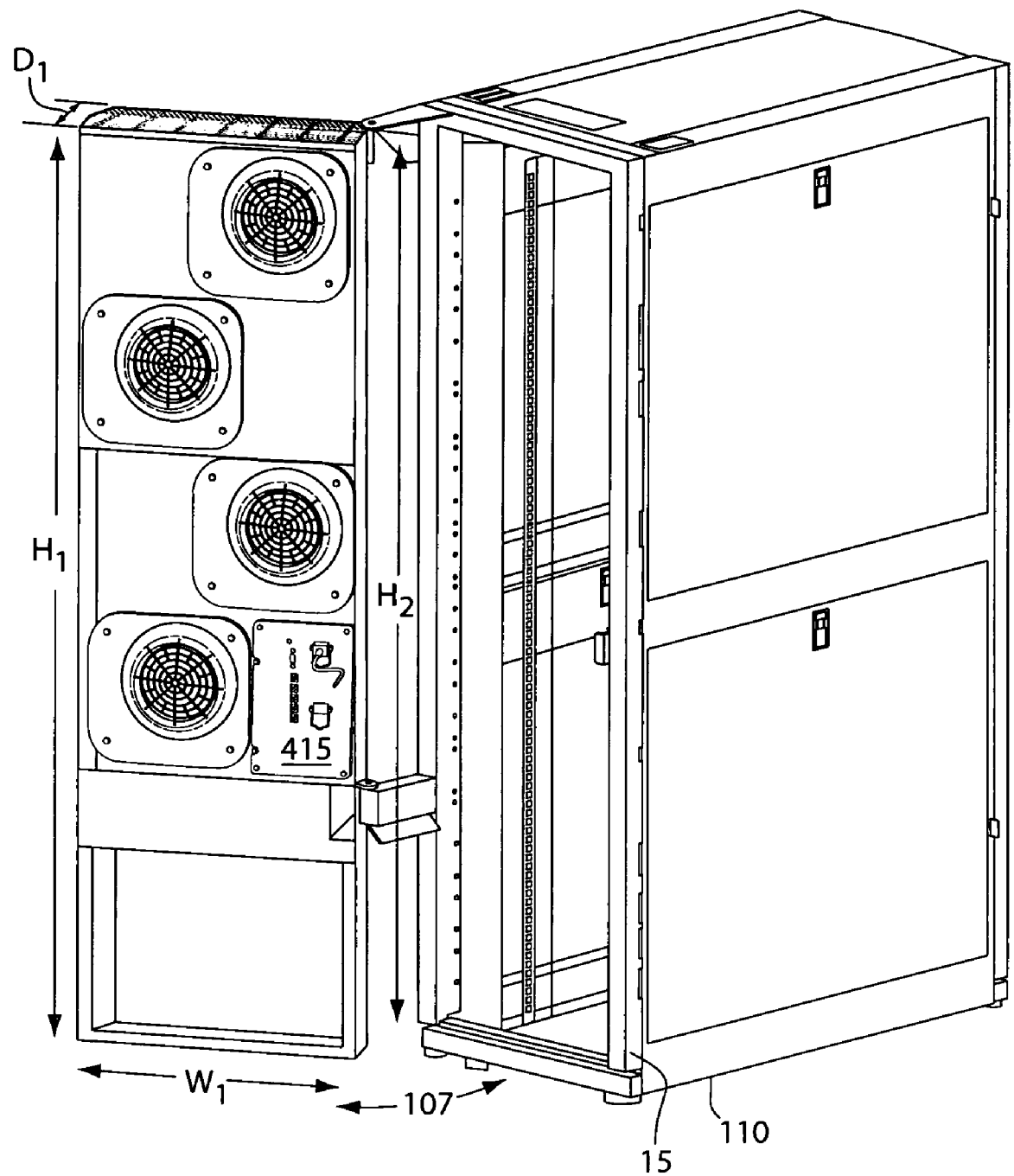
FIG. 6F is a front perspective view of the frame assembly and the unit shown in FIG. 6D attached to a standard-dimensioned rack or enclosure with the unit disposed in an open position.

Referring to FIGS. 6D-6E, the chassis housing 12 of the unit 10 is further constructed and arranged to permit a blanking panel 35 to be connected or mounted to a lower portion of the unit 10. The blanking panel 35 may be connected or mounted to the bottom plate 13 of the housing 12 and/or each of the side walls 16 and 18 of the housing 12 by connectors, e.g., screws, nut/bolt combinations or the like, suitable for removably connecting the blanking panel 35 to the housing 12 and thereby to the unit 10. As shown in FIG. 6E, the blanking panel 35 is constructed and arranged and connected to the unit 10 such that when the unit 10 is installed to an equipment rack or enclosure, the blanking panel 35 is positioned to blank-off or fill-in an area below the unit 10 where the rack or enclosure is exposed or otherwise open to areas external to the unit 10. The blanking panel 35 is disposed and is constructed and arranged to help to prevent exhaust air from venting from the unit 10 and/or entering into the rack or enclosure to which the unit 10 is installed. The blanking panel 35 thereby helps to reduce or to prevent the loss of exhaust air from the fan modules 28A, 28B and 30A, 30B and the unit 10 during operation of the unit 10. Reducing or preventing the loss of exhaust air from the unit 10 helps to ensure that exhaust air does not circulate to operating equipment components within the rack or enclosure.

As shown in FIG. 6D, the blanking panel 35 is further configured to include an upper panel 35A that telescopically receives a lower panel 35B such that the lower panel 35B slidably extends from or retracts into the upper panel 35A to adjust the vertical length or height of the blanking panel 35. Like the upper and the lower members 33 and 41 of the frame assembly 15, the upper and lower panels 35A and 35B of the blanking panel 35 slide or telescope with respect to one another in certain increments, e.g., wherein the increments are defined in U units including 1U increments, 2U increments or more, in order to readily extend or retract the lower panel 35B to accommodate the height of an exposed area of a rack or enclosure disposed below the unit 10 when the unit 10 is installed to the rack or enclosure. The increments with which the upper and lower panels 35A and 35B slide or telescope with respect to one another are preferably the same increments with which the upper and lower members 33 and 41 of the frame assembly 15 slide or telescope with respect to one another.

The invention is not limited with respect to the blanking panel 35 as described with reference to FIGS. 6D-6E, and anticipates that other configurations of the blanking panel 35 may be used with the unit 10 and the frame assembly 15 as disclosed. For instance, the blanking 35 may include a solid panel as opposed to telescoping panels 35A and 35B to blank-off or fill-in the exposed area below the unit 10 to help to prevent loss of cooling air from within a rack or enclosure and to help to prevent flow of ambient or exhaust air into the rack or enclosure. Alternatively, the chassis housing 12 of the unit 10 may define a longer vertical length or height $H_1$ such that the housing 12 is extended sufficiently along its lower portion to blank-off or fill-in the exposed below the unit 10 and to thereby eliminate the need for the blanking panel 35. In this case, the extended housing 12 is defined with an elongated front panel 14 and elongated side walls 16 and 18 with sufficient length to accommodate the exposed are area below the unit 10. Those of ordinary skill in the art can appreciate other configurations of the blanking panel 35 and/or the housing 12 such that the exposed area of a rack or enclosure below the unit 10 may be satisfactorily closed or filled-in to prevent airflow from and into the interior of the rack or enclosure.

Referring to FIG. 6F, and with further reference to FIGS. 6B and 6D, the hinged connections 29, 29A and 31, 31A that secure the unit 10 to the frame assembly 15 permit the unit 10 to pivot about the hinged connections, as shown by arrow 107 in FIG. 6F, to thereby enable the unit 10 to operate like a door when the unit 10 is installed to an equipment rack or enclosure. As shown in FIGS. 6D and 6F, the unit 10 pivots outwardly in a door-like manner away from the frame assembly 15. When the frame assembly 15 and the unit 10 are mounted to an equipment rack or enclosure 110, as shown in FIG. 6F, the unit 10 permits access to an interior of the rack or enclosure 110 as well as to the interior of the unit housing 12 and the fan modules 28A, 28B and 30A, 30B.

In an open position, the fan modules 28A, 28B and 30A, 30B and the electronics module 415 of the unit 10 are accessible for installation as well as for in-field maintenance, service and replacement. In particular, the fans 25 are accessible for maintenance, service and replacement, as well as the removable electronics 27 associated with each fan 25. In addition, the entire electronics module 415, as well as any components of the electronics module 415 including the interactive programmable controller 425 described below, are similarly accessible for maintenance, service, replacement and programming, if necessary, while the unit 10 is installed to the rack or enclosure 110 and during operation of the unit 10. Further, the ability of the unit 10 to operate like a door permits in-field installation, maintenance, service and replacement of rack-mounted equipment components housed within the rack or enclosure 110.

With further reference to FIGS. 1 and 6E, the front panel 14 of the unit 10 further includes features to help to permit the unit 10 to operate like a door. The front panel includes a latching handle 38 and two lift handles 40. The latching handle 38 is configured to lock and to thereby secure the unit 10 to the frame assembly 15 in a closed or locked position. Actuating, e.g., lifting, the latching handle 38 unlocks a cam of the latching handle 38 from the frame assembly 15 to permit the unit 10 to pivot about the hinged connections 29, 29A and 31, 31A such that the unit 10 moves outwardly away from the frame assembly 15. Each of the two lift handles 40 is configured to receive at least a portion of an operator's hand and is positioned along the front panel 14 of the housing 12 to help to enable an operator to lift and mount the unit 10 to the frame assembly 15.

Still referring to FIGS. 1 and 6E, the front panel 14 of the unit 10 further includes an interactive power and control display 46 including one or more LCDS and/or one or more indicator lights that display, for instance, an operating mode of the unit 10 and/or each fan module 28A, 28B and 30A, 30B, individual fan speeds, rack power consumption, internal temperatures of the unit 10 and the rack or enclosure 110 and other operating parameters and environmental conditions. The interactive display 46 is operatively connected to the electronics module 415 of the unit 10 and thereby the interactive programmable controller 425.

With further reference to FIG. 6F, the unit 10 defines a height $H_1$, a width $W_1$ and a depth $D_1$ sufficient to permit the unit 10 to house the fan modules 28A, 28B and 30A, 30B and the electronics module 415, as described above and in further detail below, and to mount or install to a new or an existing standard-dimensioned equipment rack or enclosure 110, such as a 19-inch or 23-inch rack, or an equipment enclosure housing a 19-inch or 23-inch rack. The adjustable height $H_1$ of the unit 10 provided by the telescoping panels 35A and 35B of the blanking panel 35 and the adjustable height $H_2$ of the frame assembly 15 help to permit the unit 10 to replace an existing panel or door of a standard 19-inch or 23-inch equipment rack or enclosure 110 having any of a variety of heights with little or no retrofitting of the unit 10, the blanking panel 35, the frame assembly 15 or the rack or enclosure 110.

Figure 6G:
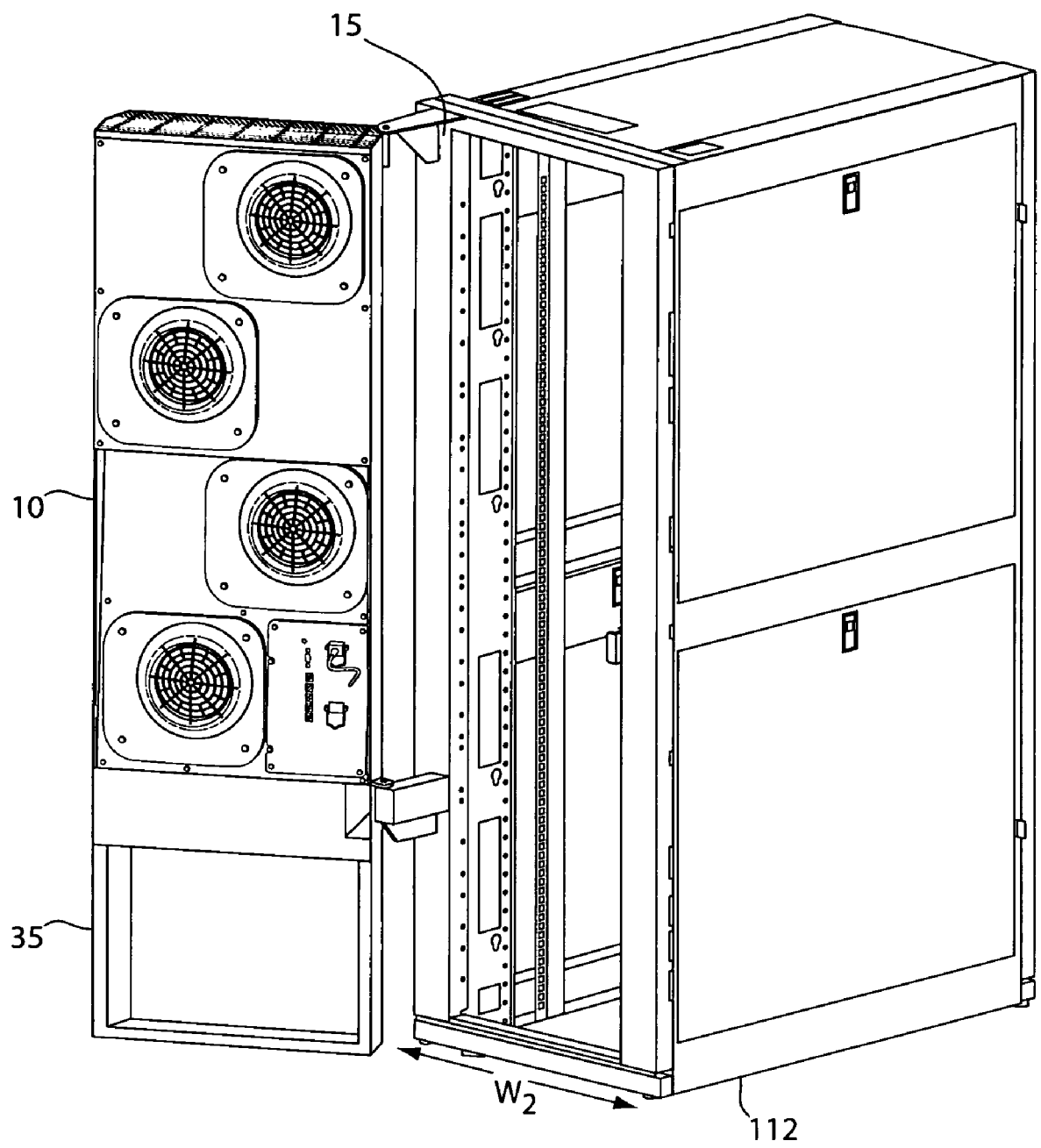
FIG. 6G is a front perspective view of the frame assembly and the unit shown in FIG. 6D attached to a non-standard dimensioned rack or enclosure with the unit disposed in an open position.

Referring to FIG. 6G and with further reference to FIG. 6A, the frame assembly 15 can be alternately constructed and arranged to mount or install to an equipment rack or enclosure 112 that defines a wider width than a standard 19-inch or 23-inch rack or enclosure. As shown in FIG. 6G, the $W_2$ of the frame assembly 15 is increased to accommodate the wider width of the rack or enclosure 112 such that the unit 10 and the blacking panel 35 mount or install to the frame assembly 15 and thereby the wider rack or enclosure 112 with little or no retrofitting of the unit 10, the blanking panel 35, and the rack or enclosure 112. The invention is not limited in this respect and envisions alternative dimensions of the frame assembly 15 to permit the unit 10 and the blanking panel 35 to mount or install to a variety of different equipment rack or enclosure designs.

Figure 7:
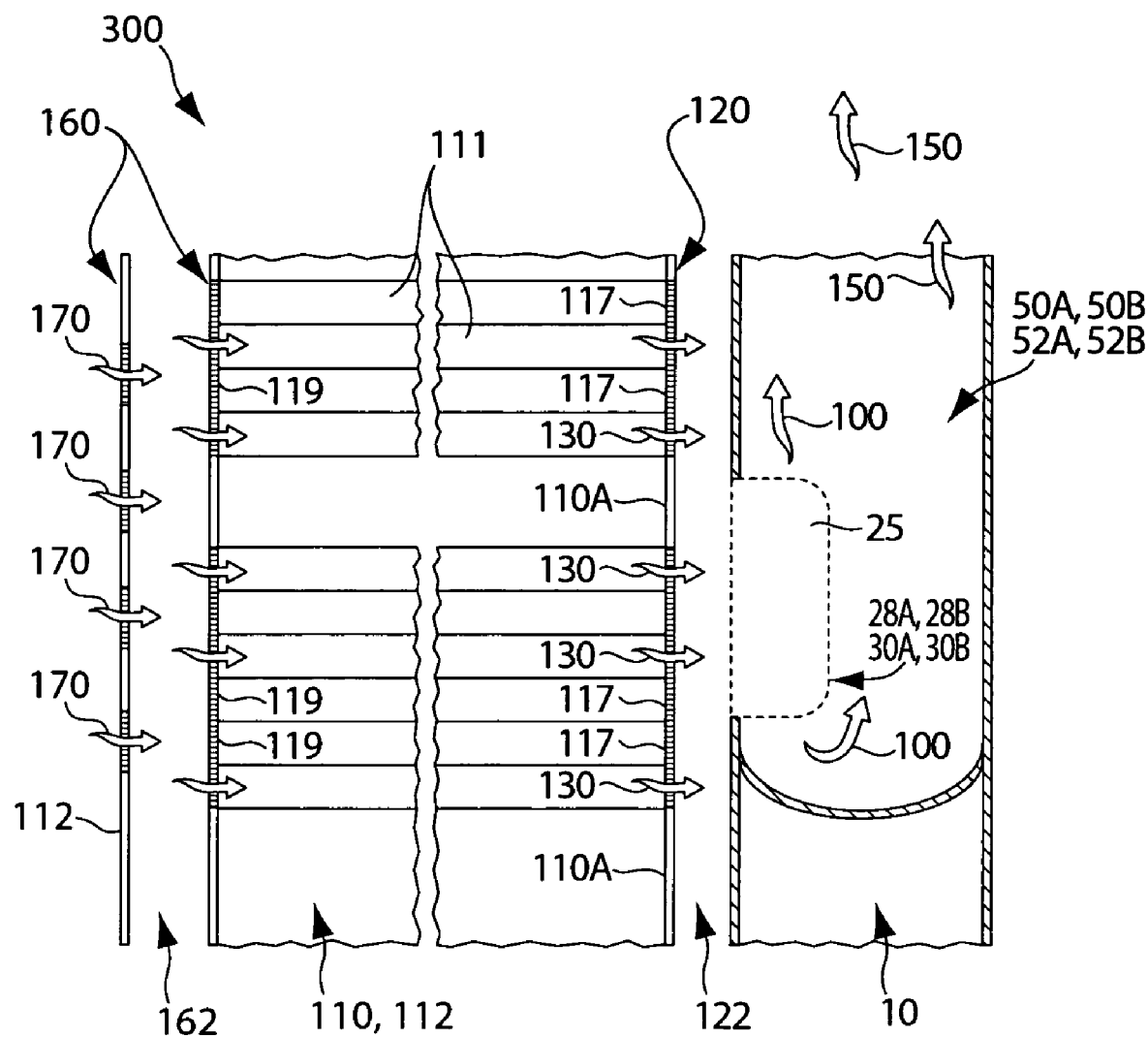
FIG. 7 is a cross-sectional side view of a portion of the unit shown in FIG. 1, FIGS. 2A and 2B and FIG. 6D and a portion of the rack shown in FIGS. 6F and 6G with the unit installed to the rack and disposed in an open position.

Referring to FIG. 7, and with further reference to FIG. 4, when the unit 10 is installed to a rack or enclosure 110 and 112, as described above and shown in FIGS. 6F and 6G, the fans 25 of each exhaust module 24 and 26 draw-in exhaust air rack-mounted equipment components 111 vent along an exhaust side 120 of the rack or enclosure 110 and 112. More particularly, the fans 25 draw-in exhaust air, shown by arrows 130 in FIG. 7, that equipment components 111 vent through exhaust vents or ports 117 defined along the equipment components 111 and/or along a back panel 110A of the rack or enclosure 110 and 112. Each fan 25 vents drawn-in air into its respective air plenum 50A, 50B and 52A, 52B, as shown by arrows 100 in FIG. 7, and the fan-exhausted air thereafter flows through the air plenums 50A, 50B and 52A, 52B to the exhaust port 32 at the top of the unit 10, as shown by arrows 150 in FIG. 7.

As a result of drawing exhaust air from the exhaust side 120 of the rack or enclosure 110 and 112, the unit 10 according to the invention also helps to draw cooling air into the rack or enclosure 110 and 112 from an air intake side 160 of the rack or enclosure 110 and 112. As shown by arrows 170 in FIG. 7, e.g., ambient air or cooled air, flows into the rack or enclosure 110 and 112 from the equipment room or data center 300 in which the rack or enclosure 110 and 112 is located. The equipment components 111 are typically equipped with internal cooling fans (not shown) that operate to draw cooling air from the intake side 160 of the rack or enclosure 110 and 112 into and across the interiors of the equipment components 111 to help to cool internal electronics during operation. Internal cooling fans therefore would need to produce airflow rates sufficient to manage the thermal output of the equipment components 111 in order to meet cooling requirements.

However, airflow rates that the equipment components 111 can achieve are affected by such factors as airflow resistance and air pressure differentials between the exhaust and the air intake sides 120 and 160 of the rack or enclosure 110 and 112. As shown in FIG. 7, an air intake area 162 is typically defined along the intake side 160 of the rack or enclosure 110 and 112 often between a front panel or door 112 and intake vents 119 of the equipment components 111. Similarly, an exhaust area 122 is typically defined along the exhaust side 120 of the rack or enclosure 110 and 112 between exhaust vents 117 of the equipment components 111 and a back panel 110A of the rack or enclosure 110 and 112, or, in the case of the invention, the back panels 21A and 21B of the unit 10.

Where significant air pressure differences exist between the exhaust and the intake areas 122 and 162, sufficient airflow into the rack or enclosure 110 and 112 can be difficult or impossible for internal cooling fans of the equipment components 111 to achieve. Pressure differentials exist, for instance, where air pressure is higher along the exhaust area 122 than along the intake area 162. Such differentials can be caused by equipment cooling fans operating to overcome airflow resistance along the intake side 160 of the rack or enclosure 110 and 112. Equipment cooling fans reduce air pressure along the intake area 162 such that higher air pressure results along the exhaust area 122 and causes airflow resistance. High air pressure along the exhaust area 122 also results from backpressure caused by curvatures and/or angles of any exhaust plenums connected to the rack or enclosure 110 and 112 such that exhaust air does not vent properly or efficiently. In addition, backpressure can be caused by an impedance of airflow through the rack or enclosure 110 and 112 due to wire bundles and/or other articles contained within the confines of the rack or enclosure 110 and 112.

In such cases of air pressure differentials and back pressure, cooling fans of the equipment components 111 must overcome the airflow resistance created within the rack or enclosure 110 and 112 in order to operate effectively, e.g., drawing-in cooling air and venting exhaust air at sufficient airflow rates. If pressure differentials and backpressure are significant and cooling fans cannot effectively overcome these conditions, the equipment components 111 would be subject to insufficient cooling and vulnerable to overheating and hot spots within the rack or enclosure 110 and 112.

Minimizing or reducing air pressure differences and/or back pressure can help the cooling fans of the equipment components 111 operate effectively as if such pressures differences and back pressure were not present within the rack or enclosure 110 and 112. The fan modules 28A, 28B and 30A, 30B of the air removal unit 10 help to remove exhaust air from along the exhaust area 162 and thereby help to minimize or reduce backpressure along the exhaust area 162, as well as help to minimize or reduce air pressure differentials between the exhaust and the intake areas 122 and 162 of the rack or enclosure 110 and 112. The air removal unit 10 according to the invention therefore not only removes and vents hot or warm exhaust air from the rack or enclosure 110 and 112 to help to manage thermal output, but also helps to ensure the cooling fans of the equipment components 111 operate properly and efficiently by drawing-in sufficient volumes of cooling air at effective flow rates to meet the cooling requirements of the equipment components 111.

Figure 8A:
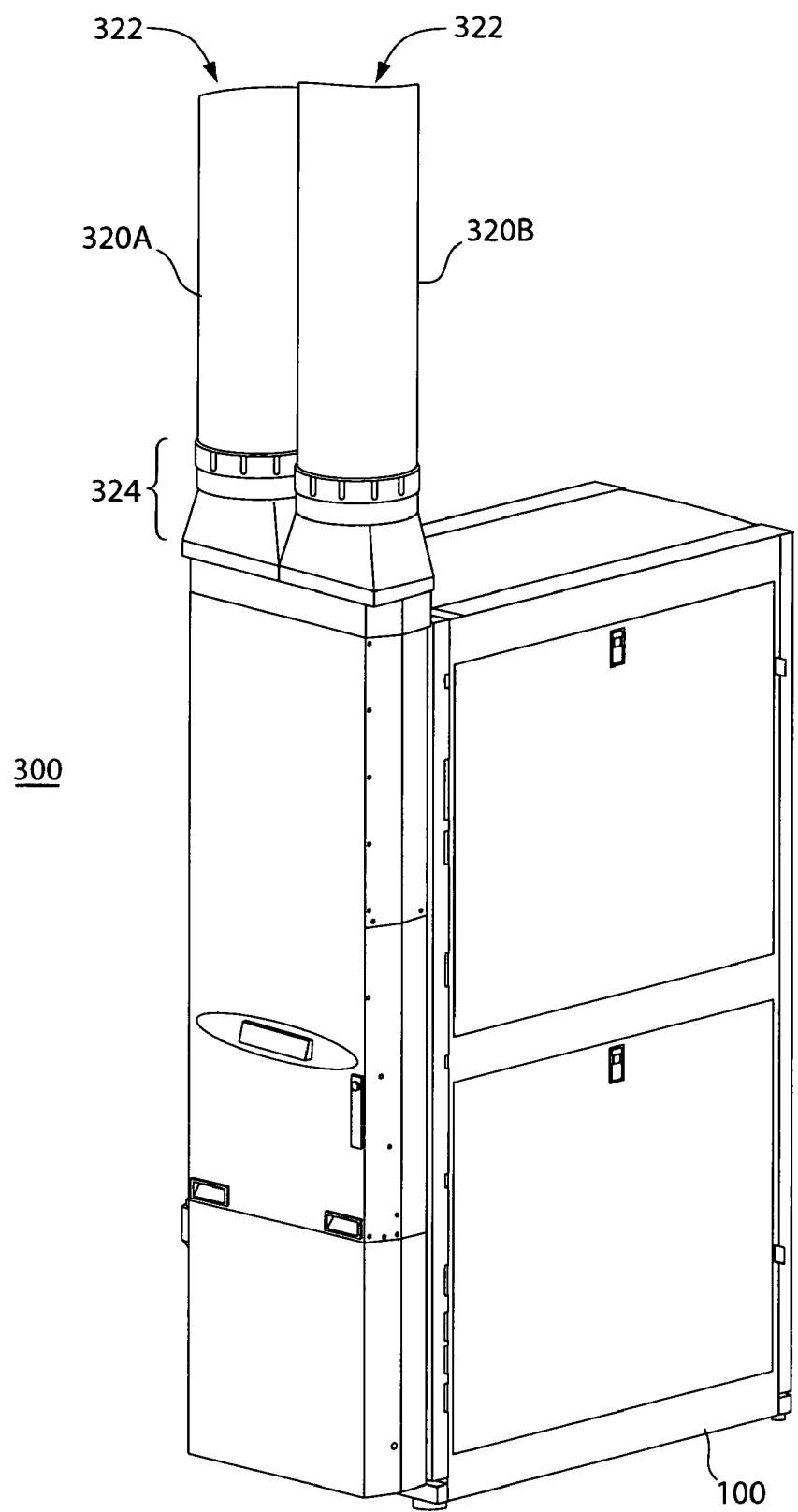
FIG. 8A is a front perspective view of the frame assembly and the unit shown in FIGS. 6F and 6G with the unit in a closed position and two exhaust air ducts attached to the unit.
Figure 8B:
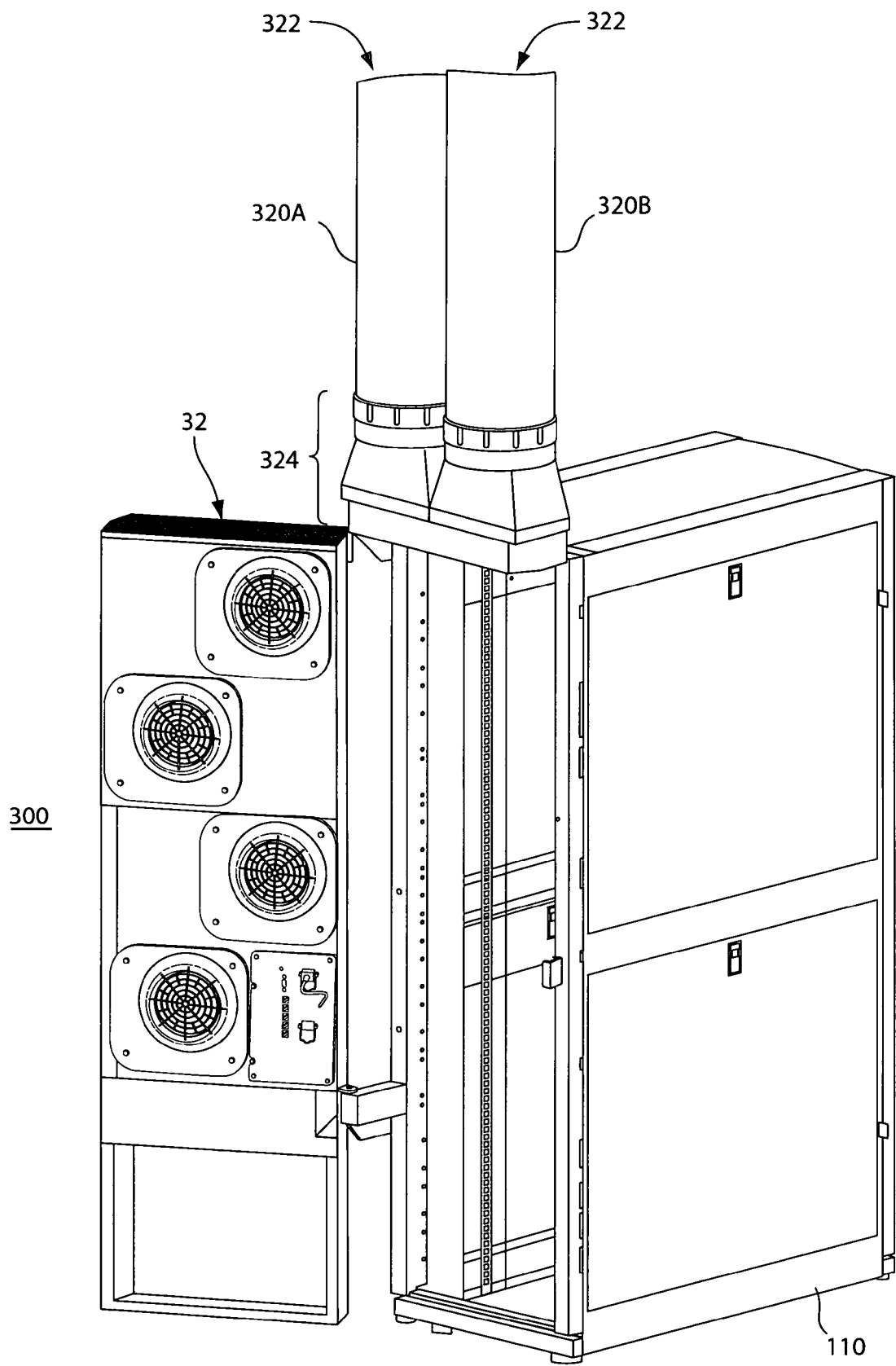
FIG. 8B is a front perspective view of the frame assembly and the unit shown in FIG. 8A with the unit in an open position.

Referring to FIGS. 8A and 8B, the unit 10 is further constructed and arranged to permit the exhaust port 32 located at the top of the housing 12 to couple with one or more air ducts or plenums 320A and 320B. The one or more ducts or plenums 320A and 320B are configured to receive exhaust air vented from the unit 10 through the exhaust port 32 and to direct the exhaust air away from the unit 10. In addition, the one or more ducts or plenums 320A and 320B are further configured along a first end 324 to couple, e.g., removably, with the upper portion of the housing 12 that defines the exhaust port 32 such that the first end 324 couples with the unit 10 to establish fluid communication between the interior of the unit 10 and the interior of the ducts or plenums 320A and 320B and to create a substantially air-tight connection between the unit 10 and the ducts or plenums 320A and 320B. The ducts or plenums 320A and 320B are thereby disposed and configured to receive and to contain exhaust air without exhaust air leaking from the ducts or plenums 320A and 320B and the unit 10 into the equipment room or data center 300 in which the unit 10 is located. As shown in FIGS. 8A and 8B, the ducts or plenums 320A and 320B may vent exhaust air directly into the equipment room or data center 300 above the unit 10 to permit the exhaust air to circulate, or, alternatively, as will be described below with reference to FIG. 9, the ducts or plenums 320A and 320B may be coupled with an additional air plenum to remove the exhaust air to an area external to the equipment room or data center 300.

As shown in FIG. 8B, when the unit 10 is in an open position relative to the equipment rack or enclosure 110 to which the unit 10 is installed, the ducts or plenums 320A and 320B are constructed and arranged to remain in the position in which the ducts or plenums 320A and 320B are disposed when connected to the unit 10 thereby permitting access to the unit 10 and the rack or enclosure 110 regardless of whether the ducts or plenums 320A and 320B are installed. In addition, although FIGS. 8A and 8B illustrate the housing 12 connected to two ducts or plenums 320A and 320B, the invention is not thereby limited and envisions that a single air duct or plenum having any of a variety of configurations and/or lengths may be similarly coupled with the exhaust port 32 to receive exhaust air from the unit 10.

Figure 9:
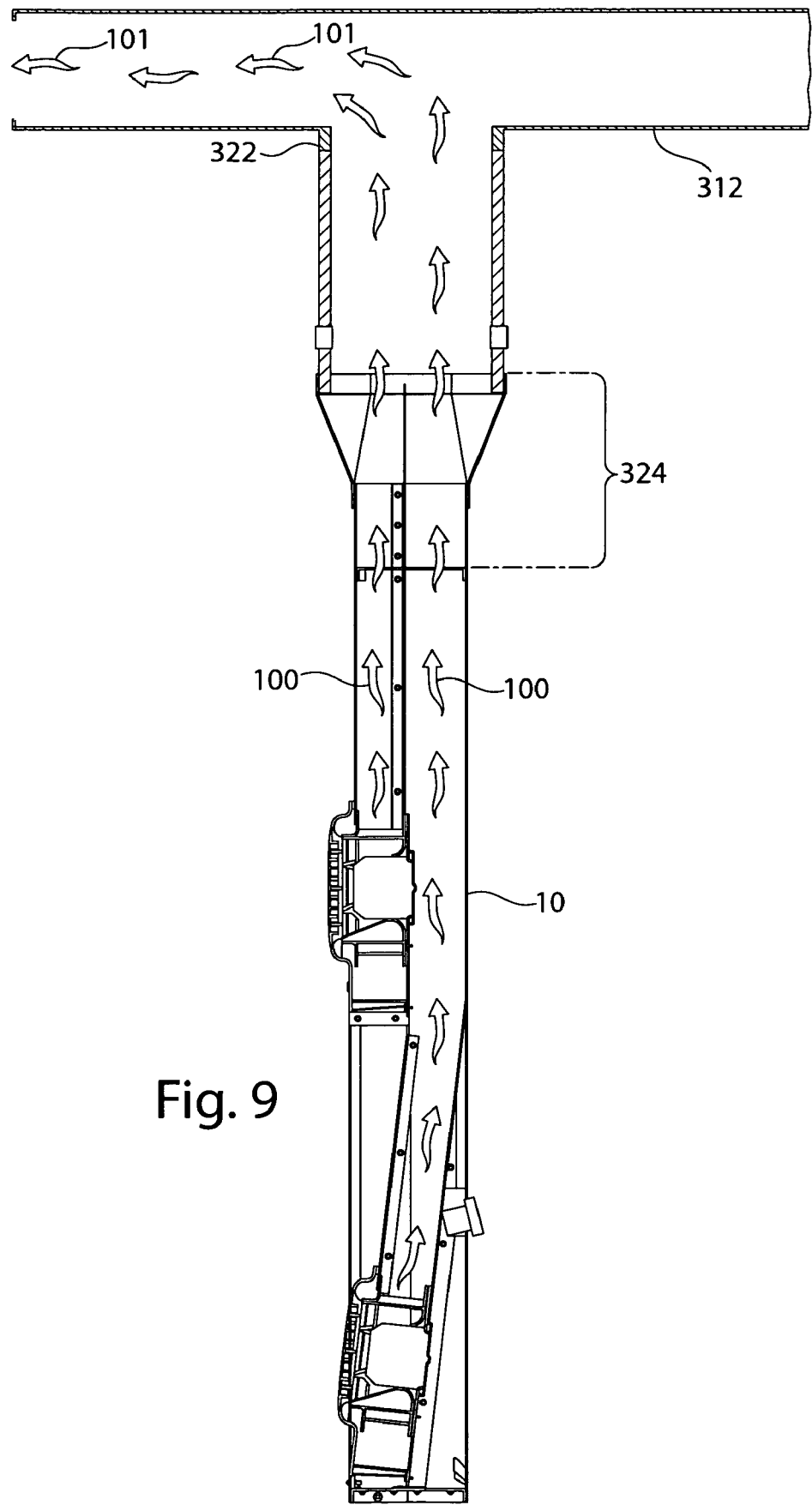
FIG. 9 is a cross-sectional side view of the unit shown in FIG. 1 and in FIGS. 2A and 2B attached to an exhaust air duct or plenum connected to a return or exhaust air plenum.

Referring to FIG. 9, and with further reference to FIGS. 8A and 8B, the one or more ducts or plenums 320A and 320B shown in FIGS. 8A and 8B are further configured along a second end 322 to couple with an exhaust or return air plenum 312 associated with the equipment room or data center 300. The second end 322 of the ducts or plenums 320A and 320B couple, e.g., removably, with the exhaust or return air plenum 312 to establish fluid communication between the interior of the air plenum 312 and the interiors of the ducts or plenums 320A and 320B and the unit 10, and to create a substantially air-tight connection with the ducts or plenums 320A and 320B. The ducts or plenums 320A and 320A are thereby disposed and configured to receive and to contain exhaust air vented from the unit 10, as shown by arrows 100 in FIG. 9, and to direct exhaust air to the exhaust or return air plenum 312 without exhaust air leaking from the ducts or plenums 320A and 320B or the unit 10 into the equipment room or data center 300.

The exhaust or return air plenum 312 may include, but is not limited to, a dropped ceiling air plenum defined within the ceiling of the equipment room or data center 300, and configured to receive air from the ducts or plenums 320A and 320B and to channel exhaust air away from the equipment room or data center 300, as shown by arrows 101 in FIG. 9. In this case, the ceiling plenum 312 may be configured and arranged to vent exhaust air to an area external to the equipment room or data center 300, or may be configured and arranged to circulate exhaust air to a ventilation system associated with the equipment room or data center 300 that isolates and vents air removed from the ceiling plenum 312 and/or the equipment room or data center 300 to any area external to the equipment room or data center 300. Alternatively, the ceiling plenum 312 may be configured and arranged to vent exhaust air to an air conditioning system associated with the equipment room or data center 300 that receives warm exhaust air from the air plenum 312 and conditions or cools the air before returning it to the equipment room or data center 300 to serve as cooling air for equipment components mounted within the rack or enclosure 110. In this case, the unit 10 may be integrated with a cooling system such as described in detail below with reference to FIG. 10. The unit 10 according to the invention provides sufficient portability and flexibility in combination with the ducts or plenums 320A and 320B and/or the exhaust or return air plenum 312 such that the invention envisions the unit 10 may be employed in any of a variety of exhaust air removal and conditioning configurations.

With further reference to FIGS. 2A and 2B and FIGS. 3A and 3B, the air removal unit 10 includes the unit's electronics module 415 disposed within the interior of the housing 12 and including, but not limited to, power and control electronics and network management electronics. The power, control and network management electronics are configured and arranged in one or more modules that are disposed and secured within the electronics module 415 and/or the vacant confines of the interior of the housing 12.

Power modules generally include a dual power input to supply power to the unit 10 and to provide electrical redundancy. In addition, control electronics modules include a local interactive programmable controller 425 and other control electronics modules, e.g., fan speed control electronics for manual and/or automatic variable fan speed control. The interactive programmable controller 425 and the control electronics modules may be provided with an operable connection to the local interactive power and control display 46 disposed along the front panel 14 of the unit 10, as shown in FIG. 1. In addition, the interactive programmable controller 425 and/or the control electronics modules may also include a remote network connector 426 to facilitate connection of the controller 425 and/or the control electronics modules to a HUB or network. The programmable controller 425, power electronics modules and control electronics modules, as well as the remote network connector 426 are all field-accessible and field-replaceable.

The connection of the interactive programmable controller 425 and other control electronics modules to the interactive power and control display 46 enables the display 46 to provide an indication, e.g., via one or more indicator lights and/or LCDs, of one or more operating parameters, e.g., set fan speed and current fan speed, as well as other operating parameters and conditions that have been detected and/or measured within the unit 10 and/or within the rack or enclosure 110 and 112 to which the unit 10 is installed. In addition, the interactive power and control display 46 includes one or more switches to provide easy scrolling of menus for operating parameters.

As shown in FIG. 3B, dual power input is provided and includes two power ports 202 and 204 to provide electrical redundancy with each power port 202 and 204 connected through a fail-proof circuitry via an AVR transformer (collectively shown as 214) to each of the fans 25 of the fan modules 28A, 28B and 30A, 30B. The power ports 202 and 204 are configured to receive power cord connectors, e.g., standard three-prong connectors, or other types of connectors appropriate for the power being supplied to the unit 10.

The fail-proof circuitry 214 is further configured to detect failure in a power supply and to switch between alternative power sources. For instance, the circuitry 214 can detect a failure in power supply from the first port 202 and in response couple the second port 204 that is connected to an alternate power supply via the AVR transformer 214 to in turn power the fans 25. An LCD of the interactive power and control display 46 indicates which line or power source the unit 10 is operating.

Alternatively, or additionally, the power ports 202 and 204 may be connected via the fail-over circuitry 214 to four fan switches 206, 208, 210 and 212 (shown in phantom) wherein each switch is operatively coupled to one of the fans 25 to provide local on/off fan control and/or manual fan speed setting and adjustment. The fail-over circuitry 214 is configured to connect one of the ports 202 and 204 to the switches 206, 208, 210 and 212, for instance, in a normal mode of operation. Actuating/de-actuating buttons 221, 222, 223 and 224 may be associated with the switches 206, 208, 210 and 212 for turning the fans 25 on and off. In addition, actuation of the buttons 221, 222, 223 and 224 causes the switches 206, 208, 210 and 212 to close to thereby operatively couple the fail-over circuitry 214 to each fan 25 to supply electrical power. De-actuation of the buttons 221, 222, 223 and 224 causes the fan switches 206, 208, 210 and 212 to open and to break the fail-over circuitry 214 coupled to each fan 25 to thereby discontinue electrical power to the fan 25. The buttons 221, 222, 223 and 224 may be configured as manually operated actuators and/or as signal inputs that receive control signals from a local or a remote source or controller.

With further reference to FIG. 3B, each fan 25 includes associated electronics 27 that are removably connected to the fan 25 and/or the fan module 28A, 28B and 30A, 30B such that the electronics 27 are field-accessible and field-replaceable. The electronics 27 provide each fan 25 with internal temperature protection and, more specifically, with internal over temperature protection. Such electronics 27 detect when the temperature of its respective fan 25 exceeds its insulation class rating and in response disconnects the fan 25 from its power source. As a result, the fan 25 stops rotating or operating which causes the electronics 27 to transmit an output signal to the interactive programmable controller 425 indicating a failure condition. The interactive controller 425 in response provides suitable information via the remote network connector 426 to a network controller 454, as described in detail below with reference to FIG. 10. In addition, the interactive controller 425 provides information to the display 46 to indicate the required reduction in the temperature of the fan 25 and/or to indicate replacement of the fan 25 is required.

Figure 10:
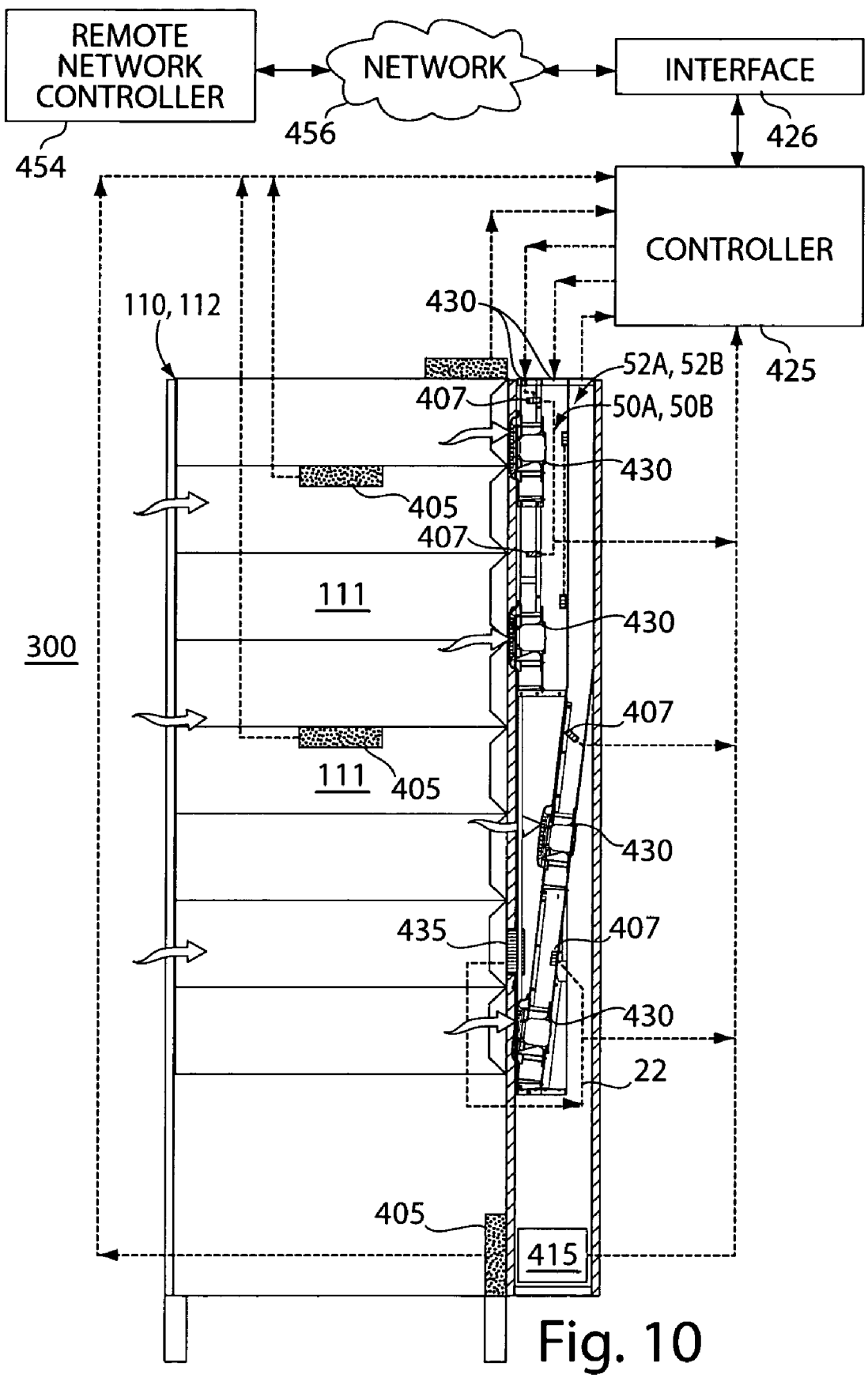
FIG. 10 is a cross-sectional side view of the unit and the rack shown in FIGS. 6F and 6G including a schematic diagram of a control arrangement including a network controller.

Referring to FIG. 10, the air removal unit 10 according to the invention can be incorporated with a remote control system including a network controller 454 and a computer network 456, such as, for instance, an intranet, Ethernet or the Internet, for remotely monitoring and controlling operating parameters and other variables of a single unit 10 or multiple units 10 installed in one or more equipment rooms or data centers. In this case, the network controller 454 is operatively connected via the computer network 456 and the remote network connector or interface 426 with the interactive programmable controller 425, incorporated locally with the unit's 10 power and control electronics module 415. Alternatively, the interactive controller 425 may be disposed remotely from its respective unit 10 and similarly connected to the network controller 454.

For instance, the remote network controller 454 is configured and designed to monitor and to control fan speeds of a single unit 10 or a multiple of units 10 in response to operating variables and parameters including, but not limited to, temperature(s) within each unit 10 and/or temperature(s) within each rack or enclosure 110 and 112. The network controller 454 thereby enables fan speed control to be remotely and automatically implemented using the interactive programmable controller 425. Alternatively, or additionally, fan speed control may be implemented locally and automatically and/or manually using the controller 425 locally disposed within the housing 12 of the unit 10.

With further reference to FIG. 10, monitoring and controlling fan speeds further includes multiple thermal sensors 407 disposed within the unit 10 at various locations to detect and to monitor temperature(s) within the unit 10. The thermal sensors 407 are configured and designed to measure temperature and to transmit output signals to the interactive programmable controller 425. In addition, multiple thermal sensors 405 may be disposed within the rack or enclosure 110 and 112 at various locations to detect and to monitor temperature(s) within the rack or enclosure 110 and 112. The thermal sensors 405 are similarly configured and designed to measure temperature and to transmit output signals to the controller 425.

Such sensor signals provided by the thermal sensors 405 and 407 are representative of the measured value(s) of temperature(s) at a given time(s). Such measured temperature value(s) are associated with certain power load(s) of an individual equipment component 111, one or more groups of equipment components 111, and/or the entire rack or enclosure 110 and 112. In response to receipt of the sensor signals, the interactive controller 425 processes the signals and compares the measured values received with certain standard or empirically-determined temperature values with which the controller 425 is programmed. The temperature values enable the controller 425 to determine if the current fan speeds and the current airflow rates (cfm) that such fan speeds achieve are sufficient to accommodate or manage the power load and therefore the current thermal output of the components 111 and/or the overall rack or enclosure 110 and 112. Should an adjustment of fan speed be required to increase or decrease airflow rates within the rack or enclosure 110 and 112 to accommodate a respective increase or decrease of thermal output of the individual equipment component 111, the one or more groups of components 111, and/or the entire rack or enclosure 110 and 112, the controller 425 transmits speed control signals to either boost or buck voltage inputs 430 of one or more fans 25 to thereby adjust the speed of one or more fans 25 accordingly. The controller 425 thereby helps to adjust and to thereby control flow rates the fans 25 achieve to help to remove exhaust air and to help to ensure sufficient cooling air is drawn into the rack or enclosure 110 and 112. Each fan 25 may thereby be individually or simultaneously monitored and controlled with other fans 25 of the unit 10.

As mentioned, the controller 425 is operatively connected to the local interactive power and control display 46 disposed along the front panel 14 of the unit 10 to provide via one or more LCDs and/or indicator lights a local indication of, for instance, the set and the current fan speeds, the set and the current airflow rates, the power loads of individual components 111 or one or more groups of the components 111, and/or the total power load of the rack or enclosure 110 and 112.

As shown in FIG. 10, one or more thermal sensors 407 may be disposed within the fan modules 28A, 28B and 30A, 30B at positions optimal for measuring temperatures of exhaust air the fans 25 draw into the unit 10 and/or at positions optimal for measuring temperatures of exhaust air vented from the fans 25 into their respective air plenums 50A/50B and 52A, 52B. For instance, one or more sensors 407 may be disposed along the back surface of the back panel 21A and 21B of the upper fan modules 28A, 28B and/or the lower exhaust modules 30A, 30B proximate to one or more ports 48 to which one or more of the fans 25 are installed to measure temperatures of exhaust air being drawn into the fans 25. Alternatively, or additionally, one or more sensors 407 may be disposed within one or more of the air plenums 50A, 50B and 52A, 52B to measure temperatures of exhaust air being vented from the fans 25 and channeled through the plenums 50A, 50B and 52A, 52B. The sensors 407 transmit signals to the controller 425 that are representative of the measured temperature value(s) at a give time(s) of a particular area of the unit 10.

Similarly, the one or more thermal sensors 405 disposed at various locations within the rack or enclosure 110 and 112 may be disposed at optimal positions for measuring temperatures of intake air, the interior of the rack or enclosure 110 and 112 and/or exhaust air vented from equipment components to provide output signals to the controller 425 that are representative of measured value(s) of temperature(s) at a given time(s) within the rack or enclosure 110 and 112.

As discussed above, the controller 425 processes the signals received from the temperature sensors 405 and 407 and compares the measured values received with certain standard or empirically-determined temperature values, e.g., preset temperatures and/or ranges of temperatures, correlated with airflow rates (cfm) and fan speeds to determine the fan speed adjustment required to adjust temperatures within the unit 10 and/or within the rack or enclosure 110 and 112 to within an acceptable range or preset temperature.

Further, the controller 425 can be configured to receive signals from one or more sensors 435 located within the unit 10 and operatively connected to the latching handle 38 of the front panel 14 of the unit 10 to indicate whether the unit 10 is in an "open" position or a "closed" position relative to the frame assembly 15 and the rack or enclosure 110 and 112 to which the unit 10 is installed. In this case, one or more sensors 335 are operatively connected to the interactive programmable controller 425. In response to receipt of one or more signals from one or more of the sensors 435, for instance, indicating the unit 10 is in an "open" position, the controller 425 can send one or more signals to the signal inputs 430 of one or more fans 25 to thereby shut down the one or more fans 25 in response to the "open" position of the unit 10. The controller 425 and the one or more sensors 435 thereby provide the unit 10 with an automatic "on/off" capability in response to the position of the unit 10 with respect to the rack or enclosure 110 and 112 to which it is installed.

Figure 11:
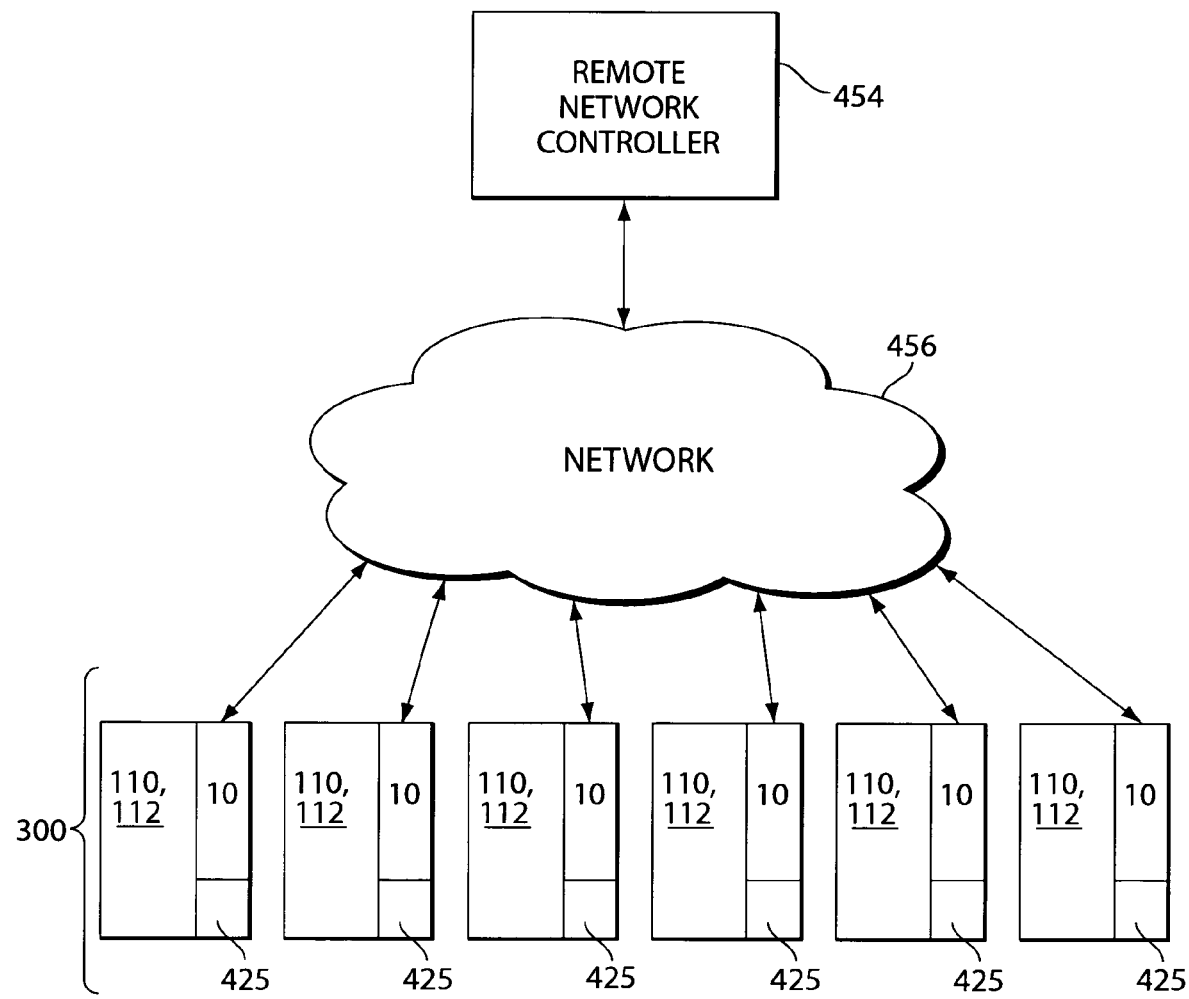
FIG. 11 is a schematic diagram of the control arrangement shown in FIG. 10 applied to multiple units located within an equipment room or data center.

Referring to FIG. 11, multiple units 10 installed to multiple equipment racks or enclosures 110 and 112 located within one or more equipment rooms or data centers 300 may be similarly automatically monitored and controlled via the remote network controller 454. As shown in FIG. 11, a multiple of units 10, with each unit 10 including the local interactive programmable controller 425 disposed within its housing 12, is monitored and/or controlled remotely with the network controller 454. The network controller 454 is operatively coupled to each interactive programmable controller 425 via the computer network 456. As described above, each interactive controller 425, as well as other control electronics modules, are operatively coupled with the network controller 454 via the remote network connector or interface 426 in order to transmit to the network controller 454 information the controller 425 generates in response to one or more detected and/or measured operating parameters, e.g., measured value(s) of temperature(s) at a given time(s) within one or more of the units 10, as well as in response to one or more detected and/or measured environmental conditions within one or more of the racks or enclosures, e.g., measured value(s) of the total power load(s) of one or more racks or enclosure 110 and 112. In response to receipt of information, such as measured temperature values, from each controller 425, the network controller 454 transmits output signals, e.g., speed control signals to either boost or buck voltage inputs of one or more fans 25 within a single unit 10 or within a number of units 10 to thereby control individual fans 25 within the unit 10 and/or individual units 10 within the equipment room or data center 300. As those of ordinary skill in the art can appreciate, any of a variety of operating parameters of the individual units 10 and a multiple of units 10, as well as environmental conditions of individual racks or enclosures 110 and 112 and a multiple of racks or enclosures located in one or more equipment rooms and data centers 300, can be detected, measured and/or controlled via the network controller 454 in response to information transmitted from local controllers 425 and/or in response to output signals representative of detected conditions and measured values transmitted from different types of sensors via the network 456.

Figure 12:
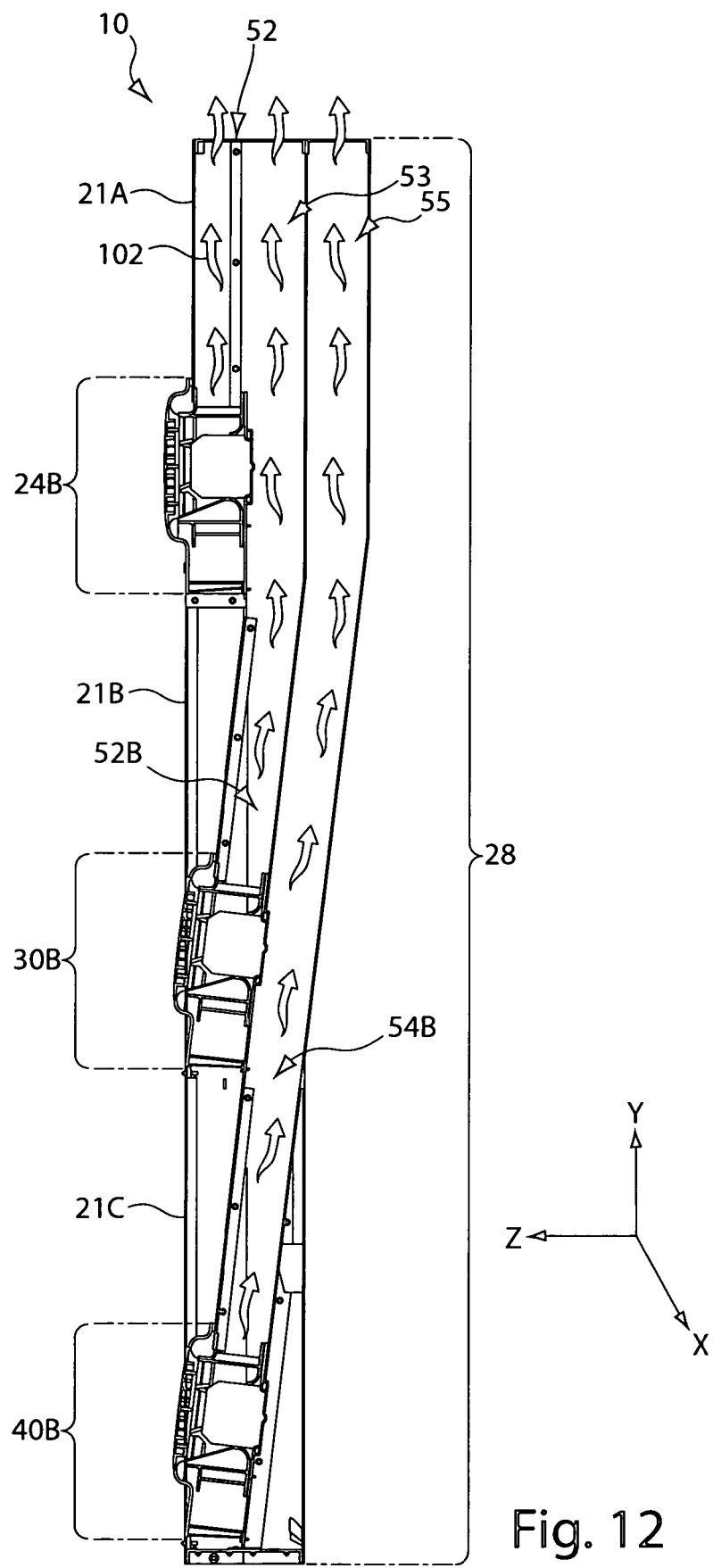
FIG. 12 is a cross-sectional side view of an air removal unit according to another aspect of the invention including an additional fan module.

Referring to FIG. 12, in another aspect of the invention, the unit 10 includes an additional exhaust module 28 coupled with the upper and the lower exhaust modules 24 and 26 as described above. As shown in FIG. 12, the additional exhaust module 28 is disposed with the stacked configuration of the exhaust modules 24 and 26 along the axis of depth Z of the unit 10. The additional exhaust module 28 essentially couples with the lower exhaust module 26 and thereby increases the depth of the unit 10. The additional exhaust module 28 includes one or more fan modules 40B as described above to provide one or more additional fans 25 to the unit 10. The additional exhaust module 28 further defines an internal air plenum 54B for each fan module 40B that is configured and disposed to channel fan-exhausted away from each fan module 40B into an air plenum 55 that directs fan-exhausted air away from each fan module 40B to the exhaust port 32 at the top of the unit 10.

As shown in FIG. 12, the one or more fan modules 40B of the additional exhaust module 28 are disposed in an offset and angled orientation relative to the upper fan modules 28A, 28B and the lower fan modules 30A, 30B to orient the fans of the additional fan modules 40B outwardly away from a back panel 21C of the additional exhaust module 28. As described above, the stacked configuration of the exhaust modules 24, 26 and 28 and the offset and angled orientation of the lower fan modules 30A, 30B and the one or more additional fan modules 40B help to increase airflow capacity of the unit 10 while maintaining the compact and portable design of the unit 10.

Those of ordinary skill in the art can appreciate other configurations and arrangements of the upper and lower exhaust modules 24 and 24 and the additional exhaust module 28 to increase or decrease the airflow capacity of each module 24, 26 and 28, e.g., addition or removal of individual fan modules 28A, 28B, 30A, 30B and 40B, and to increase or decrease the air removal or exhaust capacity of the unit 10, e.g., addition or removal of individual exhaust modules 24, 26 and 28.

Figure 13:
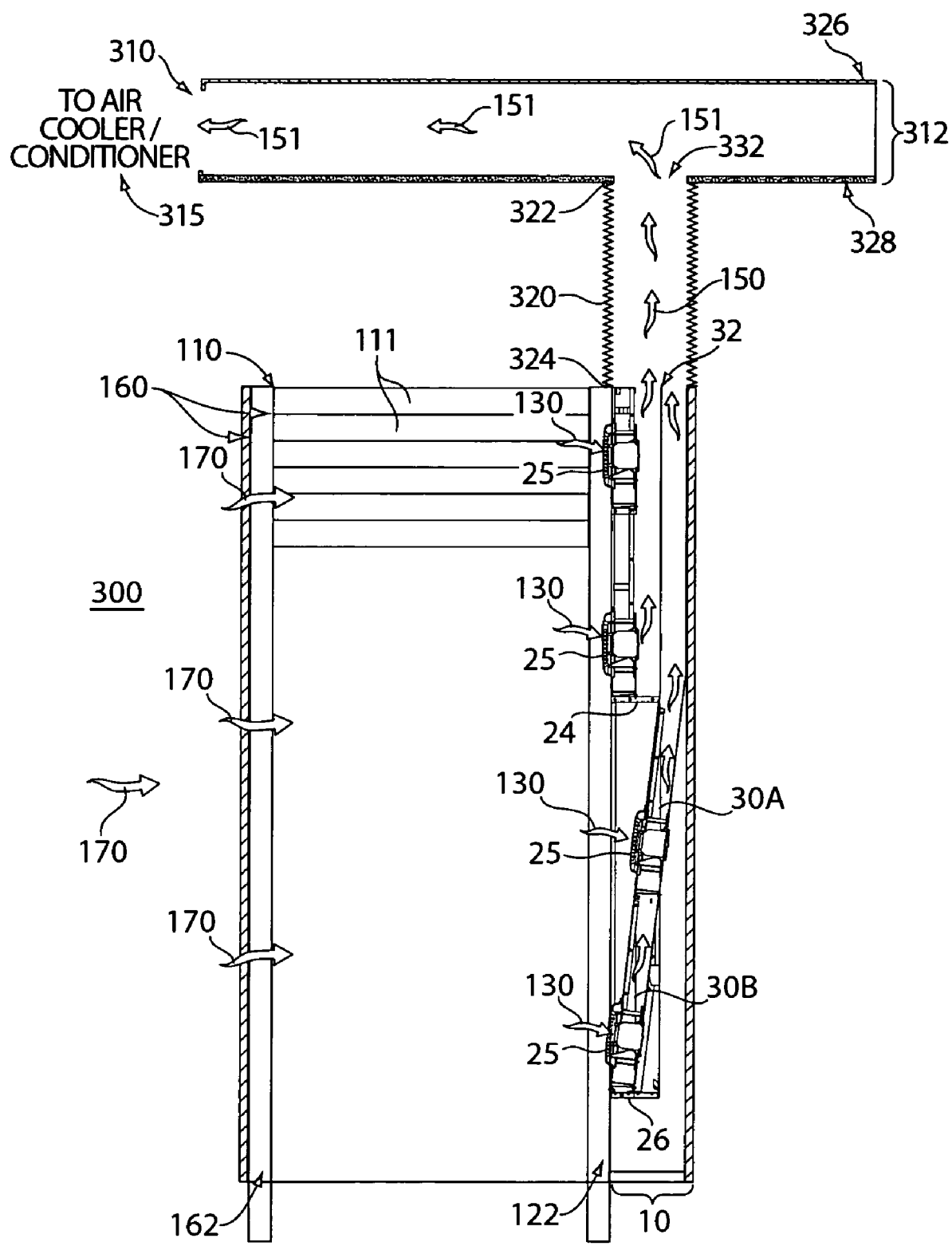
FIG. 13 is a cross-sectional side view of the unit and the rack shown in FIGS. 6F and 6G incorporated with a cooling air system.

Referring to FIG. 13, in a further aspect, the invention provides a cooling air system 310 for supplying an equipment room or data center 300 with conditioned air, e.g., cooled air that incorporates the air removal unit 10 according to the invention. The cooling air system 310 supplies air to the equipment room or data center 300 at preferred temperature(s), e.g., ranging from about 60° F. to about 70° F., such that ambient air conditions within the equipment room or data center 300 are created and maintained that help equipment components 111 mounted within a rack or enclosure 110 meet cooling needs. Maintaining temperature(s) of the equipment room or data center 300 within a desired range is achieved by supplying conditioned air to the equipment room or data center 300 at preferred temperature(s) while removing and containing exhaust air produced by the rack or enclosure 110 and venting exhaust air with the unit 10 from the equipment room or data center 300. In this manner, the system 310 helps to prevent hot and warm exhaust air from mixing with cooling ambient air circulating within the equipment room and data center 300. In addition, the system 310 helps to ensure effective operation of cooling fans of equipment components 111 such that fans draw-in sufficient volumes of ambient air at effective flow rates to meet cooling needs to thereby help to minimize or prevent overheating and hot spots with the rack or enclosure 110.

The cooling air system 310 includes the air removal unit 10 according to the invention and further includes an exhaust or return air plenum 312, such as a ceiling plenum, one or more ducts 320 to connect the air removal unit 10 to the exhaust or return air plenum 312 and an air cooler or conditioner 315 located within or exterior to the equipment room or data center 300 to cool or condition returned exhaust air. As shown in FIG. 13, the return air plenum 312 is placed in fluid communication with the fan modules 28A, 28B and 30A, 30B and their respective internal air plenums 50A, 50B and 52A, 52B of the unit 10 via the duct 320. The duct 320 is configured to connect over the exhaust port 32 of the unit 10.

The return air plenum 312 is preferably a ceiling plenum constructed within a ceiling of the equipment room or data center 300. The ceiling plenum 312 is bound along one plane by the ceiling 326 of the equipment room or data center 300 and bound along an opposite and parallel plane by a dropped ceiling 328. The dropped ceiling 328 may be constructed of multiple ceiling tiles 330 and may include one or more vents or ports 332.

As shown in FIG. 13, the duct 320 is configured to mate and to connect to the vent or port 332 of the dropped ceiling 328 to place the interior of the air removal unit 10 or, more specifically, the air plenums 50 and 52 of the fan modules 24 and 26 in fluid communication with the interior of the ceiling plenum 312. The ceiling plenum 312 is thereby disposed to receive exhaust air vented through the exhaust ports 58 and 60 into the duct 300 from the fan modules 24 and 26. The ceiling plenum 312 is configured to guide or channel exhaust air, as shown by arrows 151 in FIG. 13, to the air cooler or conditioner 315. The air cooler or conditioner 315 removes heat from return air and/or refrigerates air before returning it to the equipment room or data center 300.

Alternatively, the duct 320 may be configured to mate and to connect to an opening produced where one or more of the ceiling tiles 330 of the dropped ceiling 328 are removed. In either case of the duct 320 disposed over the ceiling port 332 or over an opening created by removed ceiling tile(s) 330, a first terminal end 322 of the duct is configured and arranged to removably connect to the ceiling plenum 312 and a second terminal end 324 is configured and arranged to removably connect to the exhaust port 32 of the unit 10. In this way, the cooling air system 310 is portable and flexible with respect to configuring and rearranging racks or enclosures located within the equipment room or data center 300. In addition, the removable duct 320 permits the air removal unit 10, alone or installed to the rack or enclosure 110, to be relocated within the equipment room or data center 300 without significant retrofitting or construction to reconnect the air removal unit 10 and the rack or enclosure 110 to the ceiling plenum 312.

As noted above, the air cooler or conditioner 315 may be located within the equipment room or data center 300 or may be located in an area external to the equipment room or data center 300. The air cooler or conditioner 315 includes, but is not limited to, a room-sized air conditioner unit, for refrigerating return air, or a heat exchanger assembly, for removing heat from return air. In either case, once return air is cooled, the air cooler or conditioner 315 circulates cool air back to the equipment room or data center 300, preferably, as noted above, within a range of from about 60° F. to about 70° F.

In conjunction with the exhaust air removal and containment provided by the air removal unit 10, such temperature(s) facilitate ambient air conditions within the equipment room or data center 300 that are conducive for optimal operation of cooling fans of equipment components 111. Optimal operation includes cooling fans drawing into the interiors of equipment 111 and the rack or enclosure 110 sufficient cooling air at flow rates required to meet cooling needs. Optimal operation of equipment cooling fans is also facilitated by the unit 10 removing and containing exhaust air such that exhaust air cannot mix with cooler ambient air circulating in the equipment room or data center 300 and increasing ambient air temperatures. Also, the unit 10 helps to facilitate optimal operation of equipment cooling fans by minimizing airflow resistance or high air pressure/backpressure within the rack or enclosure 110, as well as by minimizing air pressure differentials between the exhaust and the intake areas 122 and 162. Equipment cooling fans can thereby overcome any static air or airflow resistance along the intake and the exhaust areas 122 and 162 of the rack or enclosures 110. The air cooling system 310 in conjunction with the air removal unit 10 thereby helps equipment components 111 effectively cool themselves using ambient air and further helps to reduce or eliminate heat build-up and hot spots within the rack or enclosure 110.

Numerous advantages are provided by using ambient air circulating within the equipment room or data center 300 to meet equipment cooling needs. The air cooling system 310 eliminates the double or raised floor configuration, as well as other similar closed configurations, required to supply cold or chilled air to an equipment room or data center, and/or directly into racks or enclosures. In addition, the air cooling system 310 does not need cold or chilled air, e.g., air at 55° F., to achieve sufficient cooling and thereby avoids the relatively high energy requirements to supply chilled air. The air cooling system 310 also avoids the expense of operating and maintaining refrigeration equipment and raised floor infrastructure to produce and deliver chilled air.

Further, the air cooling system 310 avoids adverse environmental conditions within an equipment room or data center that can be created by supplying cold or chilled air. For instance, chilled air typically has low moisture content. Therefore, moisture may need to be added via humidification equipment to a supply of chilled air before it circulates in an equipment room or data center to provide an advantageous operating environment thereby, increasing operating and maintenance costs. In contrast, in another instance, chilled air when circulated within an equipment room or data center may result in formation of condensate within the room or center and/or within racks or enclosures housing equipment that must be removed thereby increasing equipment operating and maintenance costs.

One or more components of the air removal unit 10 according to the invention, including at least the chassis housing 12, the fan modules 28A, 28B and 30A, 30B and their respective air plenums 50A, 50B and 52A, 52B, are preferably constructed of one or more materials suitable for use with equipment components 111 that generate heat during operation, as well as suitable for use with certain air conditions, such as temperature and humidity, and other environmental conditions within a rack or enclosure 110 and 112 or the unit 10, such as formation of condensate. Suitable materials include, but are not limited to, metals, e.g., steel and aluminum, plastics, e.g., polyethylene and polypropylene, plastic resins, and combinations of such materials.

With further reference to FIGS. 1, 2A-2B, 3A-3B, 6A-6D, 6F-6G and 10, assembly and installation of the air removal unit 10 according to the invention is described. Assembly of the unit 10 and installation of the unit 10 to a rack or an enclosure 110 and 112 is relatively simple and quick, and facilitates the disassembly of the unit 10 and its components for maintenance, service and replacement. Each fan 25 and its air intake inlet ring 26 are disposed over its respective port 48 defined in the upper or the lower back panel 21A and 21, and are removably connected, e.g., with screws, nut/bolt combinations and the like, to the upper or lower back panel 21A and 21B. The upper back panel 21A is mounted to the housing 12 to mate the upper fan modules 28A, 28A with their respective upper air plenums 50A, 50B to further define the upper air plenums 50A, 50B. The upper back panel 21A is removably connected, e.g., with screws, nut/bolt combinations or the like, with the upper portion of the housing 12. Similarly, the lower back panel 21B is mounted to the housing 12 to mate the lower fan modules 30A, 30A with their respective lower air plenums 52A, 52B to further define the lower air plenums 50A, 50B. The lower back panel 21A is removably connected, e.g., with screws, nut/bolt combinations or the like, with the lower portion of the housing 12. The unit 10 is thereby assembled.

The vertical length or height $H_2$ of the frame assembly 15 is adjusted to accommodate the height of the rack or enclosure 110 and 112 to which the unit 10 is to be installed. The frame assembly 15 is removably connected, e.g., with screws, nut/bolt combinations or the like, to the rails of the rack 110 or 112 along the exhaust side 120 of the rack or enclosure 110 and 112. If necessary, the telescoping members 33 and 41 of the frame assembly 15 are further adjusted, e.g., extended and/or retracted, before or after the frame assembly 15 is mounted to the rack 110 and 112 to thereby increase or decrease the height $H_2$ of the frame assembly 15 to accommodate the U height of the rack or enclosure 110 and 112.

The assembled unit 10 is lifted such that the hinge plate 29A of the housing 12 aligns and mates with the mounting pin 30 of the lower hinge support 29 to thereby securely mount the lower portion of the housing 12 to the frame assembly 15. The uppermost portion or the top of the housing 12 is tipped into place such that the upper hinge receiving plate 31 of the frame assembly 15 aligns with the complementary hinge pin receptacle 31A disposed along the upper portion of the housing to securely mount the upper portion of the housing to the frame assembly 15.

If provided, the blanking panel 35 is removably mounted, e.g., with screws, nut/bolt combinations or the like, to the bottom plate 13 and/or to the side walls 16 and 18 of the housing 12 to secure the blanking panel to the unit 10. The vertical length of the blanking panel 35 is adjusted, e.g., via the telescoping panels to extend the vertical length of the housing 12, to blank-off or fill-in an exposed area of the rack or enclosure 110 and 112 disposed below the unit 10 when the unit 10 and the frame assembly 15 are installed to the rack or enclosure 110 and 112.

Power cords are connected to the power ports 202 and 204, preferably to couple an AC power source, e.g. a wall socket or an uninterruptible power supply outlet, to the ports 202 and 204, and to couple a battery to the ports 202 and 204. Any of the sensors described above can be operatively connected to the local interactive programmable controller 425. Operating set points and parameters, e.g., preset temperature and/or ranges of temperature(s), are set manually and/or automatically through the local controller 425, and/or are set automatically through the network controller 454.

Figure 14:
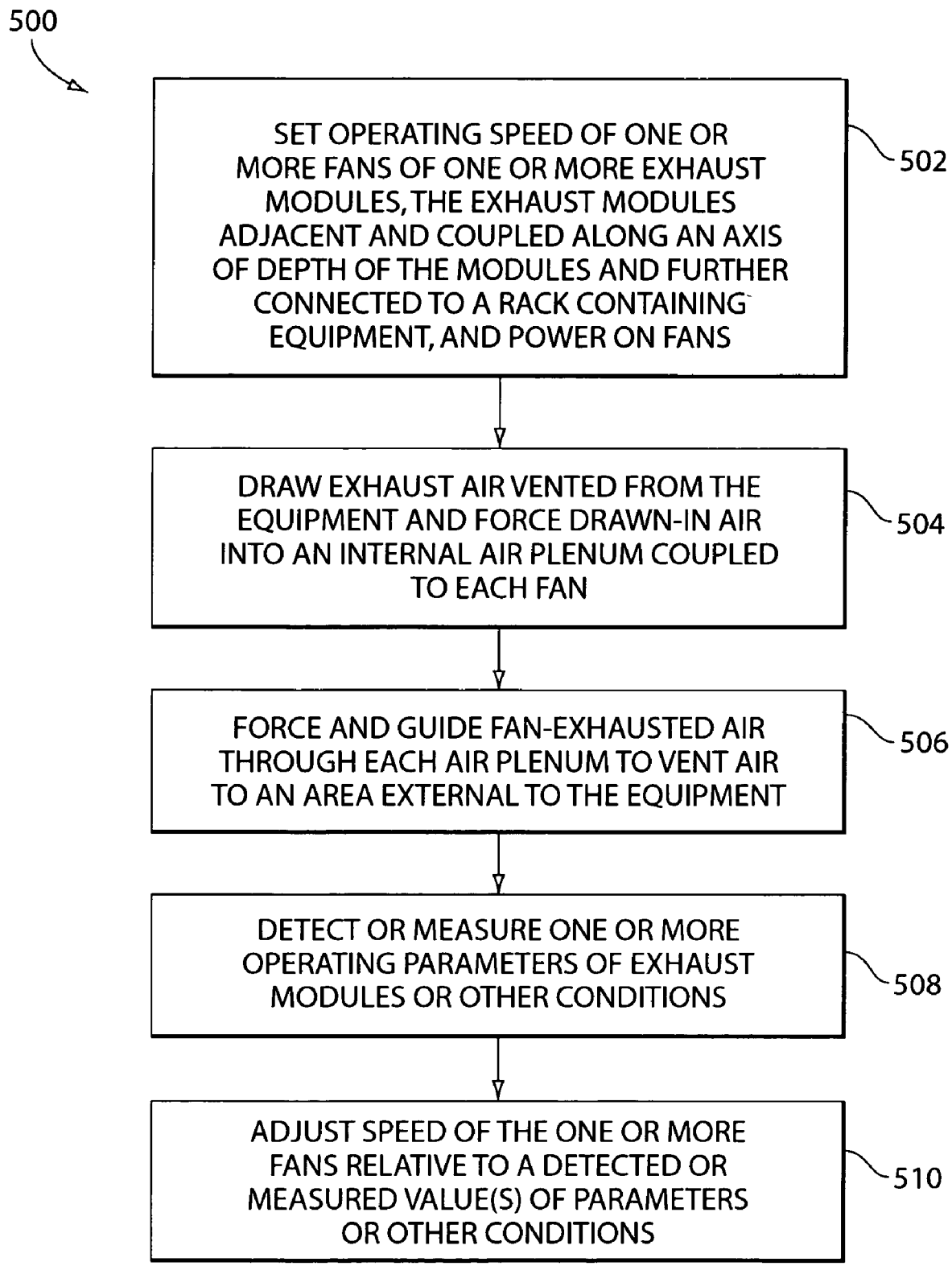
FIG. 14 is a block diagram of a method of air removal using the unit shown in FIGS. 6F and 6G and shown in FIG. 12.

Referring to FIG. 14, and with further reference to FIGS. 1, 2A-2B, 3A-3B, 6A-6D, 6F-6G, 7 and 10, in operation, a method 500 of exhausting air from an equipment rack or enclosure 110 and 112 using the air removal unit 10 according to the invention includes the stages shown. The method 500 however is exemplary and not limiting. The method 500 can be altered, e.g., by having stages added removed and/or rearranged.

At stage 502, a user selects at least a speed for each fan 25 and sets the desired speed of each fan 25 either locally, e.g., by manually or automatically actuating one or more of the actuating/de-actuating buttons 206, 208, 210 and 212, and/or remotely, e.g., by selecting and/or entering data related to fan speed using the local interactive programmable controller 425 and/or the network controller 454. Optionally, a user also selects and/or enters data related to one or more operating parameters of the unit 10 including, but not limited to, temperature(s) within the equipment rack or enclosure 110 and 112, temperature(s) within the unit 10, power load(s) of individual components 111 or groups of one or more components 111, total power load(s) of the rack or enclosure 110 and 112 and any combination thereof, using the local interactive programmable controller 425 and/or the network controller 454. The unit 10 is powered on for operation to draw exhaust air from the equipment rack or enclosure 110 and 112 and to vent exhaust air to an area external to the equipment rack or enclosure 110 and 112.

At stage 504, the rings 66 of impellers, blades and/or fins 68 of the fans 25 rotate and thereby draw-in air from along the exhaust side 120 of the rack or enclosure 110 and 112 through the rings 66. The actions of the fans 25 of each of the fan modules 28A, 28B and 30A, 30B draw air into the internal regions 70 of the fans 25. Drawn-in air is forced by the fans 25 from the internal regions 70 by the impellers, blades and/or fins 68 into the respective internal air plenums 50A, 50B and 52A, 52B defined within the housing and the upper and the lower exhaust modules 24 and 26. Drawing actions of the fans 25 help to lower air pressure and thereby help to reduce airflow resistance along the exhaust side 120 of the rack or enclosure 110 and 112 and, in particular, along the exhaust area 122 defined within the rack or enclosure 110 and 112. Reducing airflow resistance along the exhaust side 120 and along the exhaust area 122 helps to minimize any air pressure differential that exists between the intake side 160 and the exhaust side 120 of the rack or enclosure 110 and 112. In addition, helping to reduce airflow resistance along the exhaust side 120 and/or helping to minimize air pressure differentials within the rack or enclosure 110 help to facilitate optimal and/or effective operation of cooling fans disposed within interiors of the equipment components 111 such that the cooling fans draw into the rack or enclosure 110 and 112 and into interiors of the equipment components 111 sufficient cooling air at an effective flow rate to meet cooling needs of the components 111.

At stage 506, the fans 25 push fan-exhausted air through the respective air plenums 50A, 50B and 52A, 52B and the air plenums channel the fan-exhausted air substantially upward toward the exhaust port 32. The exhaust port 32 vents fan-exhausted air to an area external to the unit 10 and the rack or enclosure 110 and 112, e.g., ambient air space of an equipment room or data center 300 and/or to an exhaust or return air plenum 312 that circulates air from the equipment room or data center 300 to ventilation system or an air cooler/conditioner system 315.

At stage 508, at least one sensor, e.g., thermal sensor 405 and 407, detects and/or measures one or more conditions, e.g., temperature(s) within the unit 10 at a given time(s), and transmits output signals representative of the detected and/or measured value(s) of the one or more conditions to either the local controller 425 and/or the network controller 454. The local controller 425 and/or the network controller 454 receives the signals and processes the signals to determine whether action is required to adjust the one or more conditions, e.g., fan speeds of one or more fan modules 28A, 28B and 30A, 30B, based on the detected and/or measured value(s).

At stage 510, using the local controller 425 and/or the network controller 454, output signals, e.g., fan speed output signals, are generated and transmitted to the unit 10 and to one or more appropriate fans 25, to automatically adjust the one or more detected and/or measured conditions, e.g., airflow capacities of one or more fan modules 28A, 28B and 30A, 30B.

Having thus described at least one illustrative aspect of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. An air removal unit for removing exhaust air from an equipment rack or enclosure, the unit comprising:
    a housing defining an interior chamber, the housing having a front panel, an upper back panel, a lower back panel a lower exhaust module front panel positioned behind said front panel, and two side walls;
    an upper exhaust module disposed within the interior chamber, the upper exhaust module including at least one upper fan module removably secured to the upper back panel, the upper fan module including a fan coupled with a first internal air plenum defined by the front panel, the side walls and the upper back panel;
    a lower exhaust module disposed within the interior chamber below the upper exhaust module, the lower exhaust module including at least one lower fan module removably secured to the lower back panel, the lower fan module including a fan coupled with a second internal air plenum defined by the lower exhaust module front panel, the side walls and the lower back panel, the lower back panel and the lower exhaust module front panel extending along parallel planes that are at an acute angle with respect to a generally vertical plane defined by the upper back panel to accommodate a width of the upper fan module; and
    the upper exhaust module and the lower exhaust module being further disposed in a stacked configuration along the depth of the unit with the lower fan module positioned in an offset orientation relative to the upper fan module.

2. The unit of claim 1 wherein each fan is disposed such that when the unit is mounted to an exhaust side of the equipment rack or enclosure, an air intake side of each fan is in fluid communication with an interior of the equipment rack or enclosure.

3. The unit of claim 1 wherein the housing is constructed and arranged such that the unit forms at least part of a door of the equipment rack or enclosure when the unit is installed to the equipment rack or enclosure.

4. The unit of claim 3 wherein the housing is configured along a first side to removably connect to the equipment rack or enclosure to permit the unit to pivot toward and away from the equipment rack or enclosure along the first side in a door-like manner.

5. The unit of claim 1 further comprising a frame assembly constructed and arranged to removably connect to the equipment rack or enclosure, and further constructed and arranged to receive and constrain the unit.

6. The unit of claim 5 wherein the frame assembly is configured along a first side to removably connect to a first side of the housing, and wherein the frame assembly is connected to the housing to permit the unit to pivot toward and away from the equipment rack or enclosure in a door-like manner.

7. The unit of claim 6 wherein the first side of the frame assembly is connected to the first side of the housing via hinge means.

8. The unit of claim 5 wherein the frame assembly includes a pair of adjacent parallel longitudinal members, each longitudinal member constructed and arranged to telescopically extend or retract to adjust the height of the frame assembly.

9. The unit of claim 5 wherein the frame assembly defines a width such that the frame assembly is configured to connect to at least one of: (i) a standard-dimensioned 19-inch or 23-inch rack, and (ii) a non-standard dimensioned rack or enclosure.

10. The unit of claim 1 further comprising a blanking panel constructed and arranged to removably connect to a bottom portion of the unit and to blank-off an exposed area disposed below the unit when the unit is installed to the equipment rack or enclosure to help to minimize loss of exhaust air from the unit.

11. The unit of claim 1 wherein the first and the second internal air plenums are configured and arranged to terminate into an exhaust port defined along a top of the unit.

12. The unit of claim 1 wherein each of the first internal air plenum and the second internal air plenum are configured and arranged within the corresponding upper exhaust module and lower exhaust module such that each of the first internal air plenum and the second internal air plenum about equally impede fan-exhausted air.

13. The unit of claim 1 wherein the upper fan module draws-in air and forces drawn-in air into the first internal air plenum at least one of: (i) a rate about equal to a rate at which the lower fan module draws-in air and forces drawn-in air into the second internal air plenum and (ii) a rate variable to a rate at which the lower fan module draws-in air and forces drawn-in air into the second internal air plenum.

14. The unit of claim 1 wherein at least one of the fan of the upper fan module and the fan of the lower fan module is operatively coupled to a controller.

15. The unit of claim 14 wherein the controller is configured to control the speed of the fan.

16. The unit of claim 15 wherein the fan is configured to operate at a variable speed.

17. The unit of claim 16 wherein the controller is further configured to adjust the variable speed of the fan in response to one or more operating parameters of the unit.

18. The unit of claim 15 wherein the controller adjusts the fan speed in response to at least of: (i) one or more temperatures within the unit determined at one or more given times; (ii) one or more temperatures within the equipment rack or enclosure determined at one or more given times; and (iii) one or more power loads of the equipment rack or enclosure determined at one or more given times.

19. The unit of claim 14 wherein the controller is operatively connected to a network controller via a network and further configured to provide information to the network controller related to one or more operating parameters of the unit.

20. The unit of claim 19 wherein the network controller is configured to provide one or more control signals to at least one of the controller and the upper or the lower fan module to control the one or more operating parameters of the unit.

21. An air removal unit for removing exhaust air from an equipment rack or enclosure, the unit comprising:
a housing defining an interior chamber, the housing having a front panel, an upper back panel, a lower back panel a lower exhaust module front panel positioned behind said front panel and two side walls;
at least one upper fan module disposed within the interior chamber and removably secured to the upper back panel, the at least one upper fan module including a fan coupled with a first internal air plenum defined by the front panel, the side walls and the upper back panel;
at least one lower fan module disposed within the interior chamber below the at least one upper fan module and removably secured to the lower back panel, the at least one lower fan module including a fan coupled with a second internal air plenum defined by the lower exhaust module front panel, the side walls and the lower back panel and the lower exhaust module front panel, the lower back panel extending along parallel planes that are at an acute angle with respect to a generally vertical plane defined by the upper back panel to accommodate a width of the upper fan module;
the at least one lower fan module being coupled with the at least one upper fan module in a stacked configuration along the depth of the unit such that an air intake side of the at least one lower fan module positioned in an offset orientation relative to an air intake side of the at least one upper fan module.

22. An air removal unit for removing exhaust air from an equipment rack or enclosure, the unit comprising:
a housing defining an interior chamber, the housing having a front panel, an upper back panel, a lower back panel a lower exhaust module front panel positioned behind said front panel and two side walls;
a first and a second upper fan module disposed in the interior chamber, each upper fan module being removably secured to the upper back panel and including a fan coupled with an upper internal air plenum defined by the front panel, the side walls and the upper back panel, the first and second upper fan modules disposed adjacent one another along the width of the unit;
a first and a second lower fan module disposed in the interior chamber below the first and second upper fan modules, each lower fan module being removably secured to the lower back panel lower exhaust module and including a fan coupled with a lower internal air plenum defined by the front panel, the side walls and the lower back panel, the first and second lower fan modules disposed adjacent one another along the width of the unit, the lower back panel and the lower exhaust module front panel extending along parallel planes that are at an acute angle with respect to a generally vertical plane defined by the upper back panel to accommodate a width of the upper fan module; and
the first and second upper fan modules and the first and second lower fan modules being further disposed in a stacked configuration along the depth of the unit with the first and second lower fan modules positioned in an offset orientation relative to the first and second upper fan modules.

23. A system for exhausting air from an equipment rack or an equipment enclosure, the system comprising:
an air removal unit constructed and arranged to mount to a section of the equipment rack or enclosure from which exhaust air vents and to provide fluid communication between the air removal unit and an interior of the equipment rack or enclosure, the air removal unit including:
i) at least one upper fan module disposed within an interior chamber of a housing having a front panel, an upper back panel, a lower back panel a lower exhaust module front panel positioned behind said front panel, and two side walls, the at least one upper fan module being removably secured to the upper back panel and including a fan coupled with a first internal air plenum defined by the front panel, the side walls and the upper back panel, the first internal air plenum extending to an exhaust port defined at a top of the housing,
ii) at least one lower fan module disposed within the interior chamber below the at least one upper fan module, the at least one lower fan module being removably secured to the lower back panel and including a fan coupled with a second internal air plenum defined by lower exhaust module the front panel, the side walls and the lower back panel, the first internal air plenum extending to the exhaust port, the lower back panel and the lower exhaust module front panel extending along parallel planes that are at an acute angle with respect to a generally vertical plane defined by the upper back panel to accommodate a width of the upper fan module, and (iii) the at least one lower fan module being coupled with the at least one upper fan module in a stacked configuration along the depth of the unit such that an air intake side of the at least one lower fan module is positioned in an offset orientation relative to an air intake side of the at least one upper fan module; and an outer exhaust duct coupled with the exhaust port and configured to receive exhaust air from the first and second internal air plenums and to channel the exhaust air to an area external to the unit.

24. The system of claim 23 wherein the outer exhaust duct includes a return air plenum in fluid communication with an air conditioning system and configured to direct the exhaust air to the air conditioning system for cooling before the air is returned to an equipment room or data center in which the equipment rack or enclosure is located.

25. The system of claim 24 wherein the air conditioning system cools the exhaust air to a range of temperatures from about 60 degrees F. to about 70 degrees F.

26. The system of claim 23 wherein the outer exhaust duct includes an exhaust air plenum in fluid communication with a ventilation system and configured to direct the exhaust air to the ventilation system for removal from an equipment room or data center in which the equipment rack or enclosure is located.

* * * * *